United States Patent
Yokogawa et al.

(10) Patent No.: US 6,654,604 B2
(45) Date of Patent: Nov. 25, 2003

(54) EQUIPMENT FOR COMMUNICATION SYSTEM

(75) Inventors: Toshiya Yokogawa, Nara (JP); Kunimasa Takahashi, Ibaraki (JP); Masao Uchida, Ibaraki (JP); Makoto Kitabatake, Nara (JP); Osamu Kusumoto, Nara (JP)

(73) Assignee: Matsushita Electric Industrial Co. Ltd., Osaka (JP)

(*) Notice: Subject to any disclaimer, the term of this patent is extended or adjusted under 35 U.S.C. 154(b) by 0 days.

(21) Appl. No.: 09/989,270

(22) Filed: Nov. 20, 2001

(65) Prior Publication Data

US 2002/0060315 A1 May 23, 2002

(30) Foreign Application Priority Data

Nov. 21, 2000 (JP) .......................... 2000-353699

(51) Int. Cl.[7] .............................................. H04Q 7/20
(52) U.S. Cl. ................... 455/424; 455/424; 455/403; 257/9
(58) Field of Search .................... 455/403; 257/9, 257/194, 192; 357/22; 437/29, 63, 184, 56; 117/89; 438/37

(56) References Cited

U.S. PATENT DOCUMENTS

| | | | | |
|---|---|---|---|---|
| 5,013,685 A | * | 5/1991 | Chiu et al. ................... 437/184 |
| 5,091,759 A | * | 2/1992 | Shih et al. ..................... 357/22 |
| 5,284,782 A | * | 2/1994 | Jeong et al. ................... 437/29 |
| 5,324,682 A | * | 6/1994 | Tserng .......................... 437/56 |
| 5,463,978 A | * | 11/1995 | Larkin et al. .................. 117/89 |
| 5,488,237 A | | 1/1996 | Kuwata |
| 5,492,857 A | * | 2/1996 | Reedy et al. .................. 437/63 |
| 6,025,613 A | * | 2/2000 | Bito et al. ..................... 257/192 |
| 6,057,566 A | * | 5/2000 | Eisenbeiser et al. ........ 257/194 |
| 6,258,616 B1 | * | 7/2001 | Cunningham et al. ........ 438/37 |
| 6,380,569 B1 | | 4/2002 | Chang et al. |
| 6,483,100 B1 | * | 11/2002 | Williams et al. ......... 250/214.1 |
| 2002/0008242 A1 | * | 1/2002 | Hata .......................... 257/79 |

FOREIGN PATENT DOCUMENTS

| EP | 0 555 388 A2 | 8/1998 |
| JP | 05013446 A | 1/1993 |

OTHER PUBLICATIONS

Wen–Chau Liu et al.; "Application of δ–doped Wide–Gap Collector Structure for High–Breakdown and Low–Offset voltage Transistors"; American Institute of Physics; Sep. 7, 1998.

Asen Asenov et al.; "Suppression of Random Dopant–Induced Threshold Voltage Fluctuations in Sub–0.1–$\mu$m MOSFET's with Epitaxial and δ–Doped Channels"; IEEE Transaction on Electron Devices; vol. 46, No. 8; Aug. 1999.

* cited by examiner

*Primary Examiner*—David Nelms
*Assistant Examiner*—Thinh T. Nguyen
(74) *Attorney, Agent, or Firm*—Harness, Dickey & Pierce, P.L.C.

(57) ABSTRACT

Equipment for a communication system has a semiconductor device formed by integrating a Schottky diode, a MOSFET, a capacitor, and an inductor in a SiC substrate. The SiC substrate has a first multilayer portion and a second multilayer portion provided upwardly in this order. The first multilayer portion is composed of δ-doped layers each containing an n-type impurity (nitrogen) at a high concentration and undoped layers which are alternately stacked. The second multilayer portion is composed of δ-doped layers each containing a p-type impurity (aluminum) at a high concentration and undoped layers which are alternately stacked. Carriers in the δ-doped layers spread out extensively to the undoped layers. Because of a low impurity concentration in each of the undoped layers, scattering by impurity ions is reduced so that a low resistance and a high breakdown voltage are obtained.

17 Claims, 19 Drawing Sheets

FIG. 9A1    FIG. 9A2    FIG. 9A3
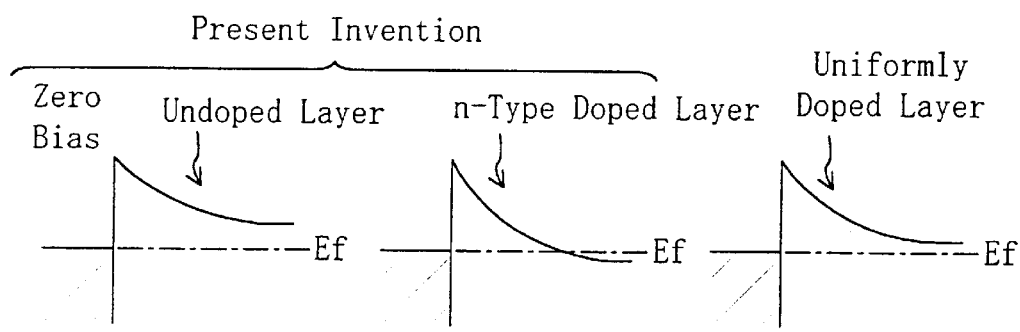
FIG. 9B1    FIG. 9B2    FIG. 9B3
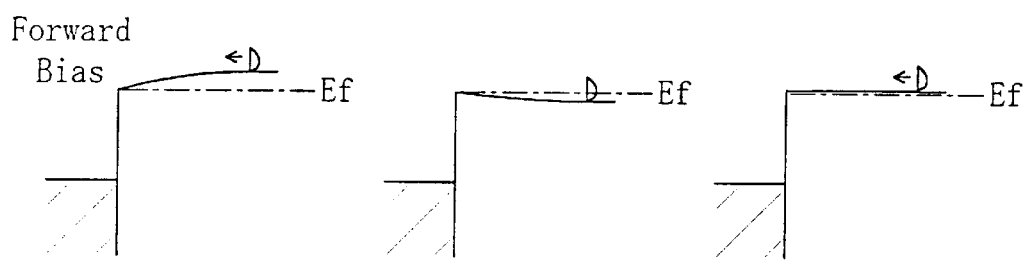
FIG. 9C1    FIG. 9C2    FIG. 9C3
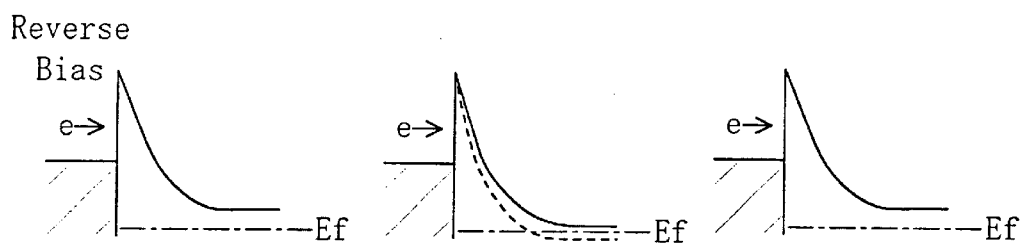

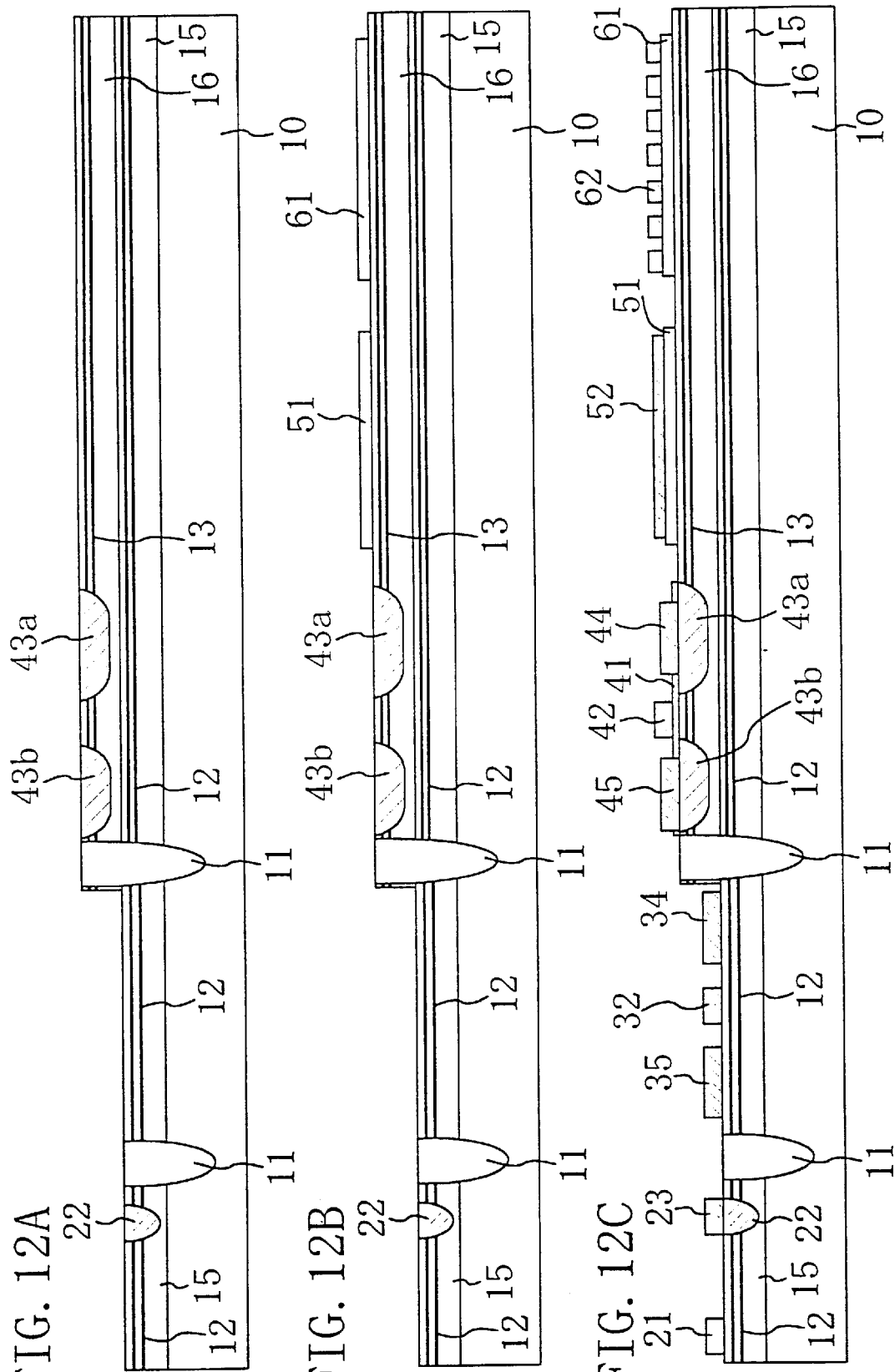

EQUIPMENT FOR COMMUNICATION SYSTEM

BACKGROUND OF THE INVENTION

The present invention relates to a semiconductor integrated circuit device in which a semiconductor power device used to achieve a high breakdown voltage and a large electric current is disposed and to equipment for a communication system which uses the semiconductor power device such as a mobile terminal or a radio base station.

A silicon carbide (SiC) having a larger band gap than silicon (Si) is a semiconductor which is high in breakdown voltage and stable even at a high temperature and is termed a power diode, a power transistor, or the like. Accordingly, an active element formed by using a SiC substrate is expected to be applied to a next-generation power device or high-temperature operating device.

In general, a power device is a generic name for a device which converts or controls high power. Exemplary applications of the power device include mobile terminal equipment functioning as a mobile station in a communication system, a car phone, or a transistor or diode disposed at a base station therein. The applications of the power device are expected to be widened in the future.

A typical modular structure used for such applications is obtained by connecting a plurality of semiconductor chips each having a power device embedded therein with wires in accordance with a use or an object and placing the connected semiconductor chips in a single package. For example, a desired circuit is constructed with semiconductor chips and wires by forming the wires on a substrate such that a circuit suitable for the use is constructed and mounting the individual semiconductor chips on the substrate. A description will be given herein below to a transmitting/receiving circuit at a radio base station which uses a Schottky diode and a MOSFET.

FIG. 20 is a block circuit diagram showing an internal structure of a conventional base station (base station in a communication system) disclosed in a document (Daisuke Ueda et al., "Radio-Frequency and Optical Semiconductor Devices Exploring New Age of Data Communication," IEICE, Dec. 1, 1999, p.124). As shown in the drawing, the circuit comprises an antenna main body, a switch, a received-signal amplifier, an amplified-signal transmitter, a radio transmitter/receiver, a baseband signal processor, an interface unit, an exchange controller, a controller, and a power supply portion. The received-signal amplifier is composed of two filters and two low-noise amplifiers (LNA) disposed in series. A mixer for mixing an output from a local amplifier with an output from an RF emitter to generate an RF signal is disposed in the radio transmitter/receiver. A power dividing/synthesizing circuit having a driver amplifier, a filter, a middle amplifier, and a main amplifier disposed therein is disposed in the amplified-signal transmitter. There are further provided a baseband signal processor for processing an audio signal, an interface unit, and an exchange controller connected to a network.

At the conventional base station, the main amplifier is so configured as to perform impedance matching by disposing an input matching circuit and a field-effect transistor (MESFET) formed by using a GaAs substrate, while disposing a capacitor, an inductor, and a resistor element on each of the input side and output side.

A MOSFET formed on a silicon substrate, a diode, a capacitor, a resistor element, and the like are disposed in the controller, the baseband signal processor, the interface unit, and the exchange controller. Such parts as a capacitor and an inductor which occupy a particularly large area are formed as independent chips.

However, the foregoing conventional communication system has the following disadvantages.

At the conventional base station, the signal amplifying elements which are the most important parts of the transmitting/receiving circuit are generally formed by using the GaAs substrate. Since the heat resistance of GaAs is low, a cooling device having a high cooling ability is required to suppress a temperature rise, so that high running cost is required to maintain the base station. If the transmitting/receiving circuit is to be applied to a mobile terminal, the circuit should be scaled down. However, there are strict positional constraints such that a GaAs MESFET and the like having a low heat resistance should be positioned at a distance from a FET and an inductor of which temperatures are easily increased by an RF signal. As a result, the transmitting/receiving circuit itself is inevitably increased in size despite various considerations given to the positional relations among the individual parts.

In addition, the signal amplifying elements which are the most important parts of the transmitting/receiving circuit and the like are provided by disposing a large number of MESFETs at a portion at which a particularly large power should be amplified. As the frequency of the RF signal is higher, however, reflected waves from the MESFETs exert multiple effects so that it is difficult to achieve impedance matching. This causes the disadvantage of increased labor required by trimming for impedance adjustment.

SUMMARY OF THE INVENTION

It is therefore an object of the present invention to provide equipment for a communication system using an active element which is suitable for placement under stringent conditions including limited space.

Equipment for a communication system according to the present invention is equipment disposed in the communication system and having an active element formed by using a compound semiconductor, the active element comprising: a compound semiconductor layer provided on a substrate; and an active region provided on the compound semiconductor layer and composed of at least one first semiconductor layer functioning as a carrier flow region and at least one second semiconductor layer containing an impurity for carriers at a high concentration and smaller in film thickness than the first semiconductor layer such that the carriers are distributed therein under a quantum effect, the first and second semiconductor layers being disposed in contact with each other.

In the arrangement, the carriers in the second semiconductor layer spread out extensively to the first semiconductor layer so that the carriers are distributed in the entire active region. Since the impurity concentration is low in the first semiconductor layer during the operation of the active element, scattering by impurity ions in the first semiconductor layer is reduced. If the active element is composed of a MESFET or a Schottky diode, therefore, the carriers flow at a particularly high speed so that a large electric current is obtainable by using a low resistance. Moreover, the whole active region is depleted in the OFF state irrespective of the mean impurity concentration in the active region which is relatively high so that the carriers no more exist in the active region. Consequently, the breakdown voltage is defined by the first semiconductor layer which is low in impurity concentration so that a high breakdown voltage is obtained in the entire compound semiconductor layer.

By disposing an active element having a high breakdown voltage and a low resistance (i.e., a high current-driving power), therefore, the number of active elements in the equipment for a communication system can be reduced so that the equipment is scaled down and impedance is adjusted more easily.

The first semiconductor layer includes a plurality of first semiconductor layers and the second semiconductor layer includes a plurality of second semiconductor layers, the first semiconductor layers and the second semiconductor layers being arranged in stacked relation. The arrangement allows the foregoing effects to be exerted more positively.

The active element is the Schottky diode in a lateral configuration. The arrangement allows the Schottky diode in conjunction with the MESFET and the like to be integrated in the single substrate. In the equipment for a communication system handling an RF signal, in particular, prominent effects can be achieved such that impedance matching is performed more easily and the operating frequency is increased.

The active element is a MISFET comprising: a gate insulating film provided on the first semiconductor layer; a gate electrode provided on the gate insulating film; and source/drain regions provided on both sides of the gate electrode in the compound semiconductor layer. In the arrangement, the impurity concentration in the first semiconductor layer is low so that the number of charges of a second conductivity type trapped in the gate insulating film and in the vicinity of the interface between the gate insulating-film and the compound semiconductor layer is reduced. This lessens the interrupting effect exerted by the charges on the flow of carriers. If carriers spread under a quantum effect, charges of a first conductivity type are trapped in the impurity in the second semiconductor layer. This allows for compensation for the effect exerted on the flow of carriers by the charges of the second conductivity type trapped in the gate insulating film and in the vicinity of the interface between the gate insulating film and the compound semiconductor layer.

The equipment for a communication system further has a capacitor and an inductor provided on the compound semiconductor layer. The arrangement allows construction of an MMIC using a compound semiconductor. Since the capacitor and the inductor are integrated in the single substrate, impedance matching can be performed more easily.

The compound semiconductor layer is a SiC layer. The arrangement achieves a high breakdown voltage by using the large band gap of SiC and high degree of integration of the equipment by using a high heat resistance.

The equipment may be a base station or a mobile station in the communication system.

The communication system may be any one of a mobile phone, a PHS, a car phone, and a PDA.

The active element is disposed in a transmitter in the communication system. The arrangement allows a structure particularly suitable for a higher-power application to be used properly.

A semiconductor integrated circuit device according to the present invention is a semiconductor integrated circuit device having an active element formed by using a compound semiconductor, the active element comprising: a compound semiconductor layer provided on a substrate; and an active region provided on the compound semiconductor layer and composed of at least one first semiconductor layer functioning as a carrier flow region and at least one second semiconductor layer containing an impurity for carriers at a high concentration and smaller in film thickness than the first semiconductor layer such that the carriers are distributed therein under a quantum effect, the first and second semiconductor layers being disposed in contact with each other.

In the arrangement, the carriers in the second semiconductor layer spread out extensively to the first semiconductor layer so that the carriers are distributed in the entire active region. Since the impurity concentration is low in the first semiconductor layer during the operation of the active element, scattering by impurity ions in the first semiconductor layer is reduced. If the active element is composed of a MESFET or a Schottky diode, therefore, the carriers flow at a particularly high speed so that a large electric current is obtainable by using a low resistance. Moreover, the whole active region is depleted in the OFF state irrespective of the mean impurity concentration in the active region which is relatively high so that the carriers no more exist in the active region. Consequently, the breakdown voltage is defined by the first semiconductor layer which is low in impurity concentration so that a high breakdown voltage is obtained in the entire compound semiconductor layer.

The semiconductor integrated circuit device according to the present invention can also be implemented in preferred embodiments similarly to the foregoing equipment for a communication system.

BRIEF DESCRIPTION OF THE DRAWINGS

FIG. 9A1 to FIG. 9C3 are energy band diagrams each showing changes in the configuration of a conduction band edge caused by changes in bias in the Schottky diode according to the embodiment and in a conventional Schottky diode;

FIG. 12A to FIG. 12C are cross-sectional views illustrating the process steps of fabricating the semiconductor device according to the embodiment from the formation of source/drain regions to the formation of the electrode or conductor film of each of elements;

DETAILED DESCRIPTION OF THE INVENTION

Figure 1:
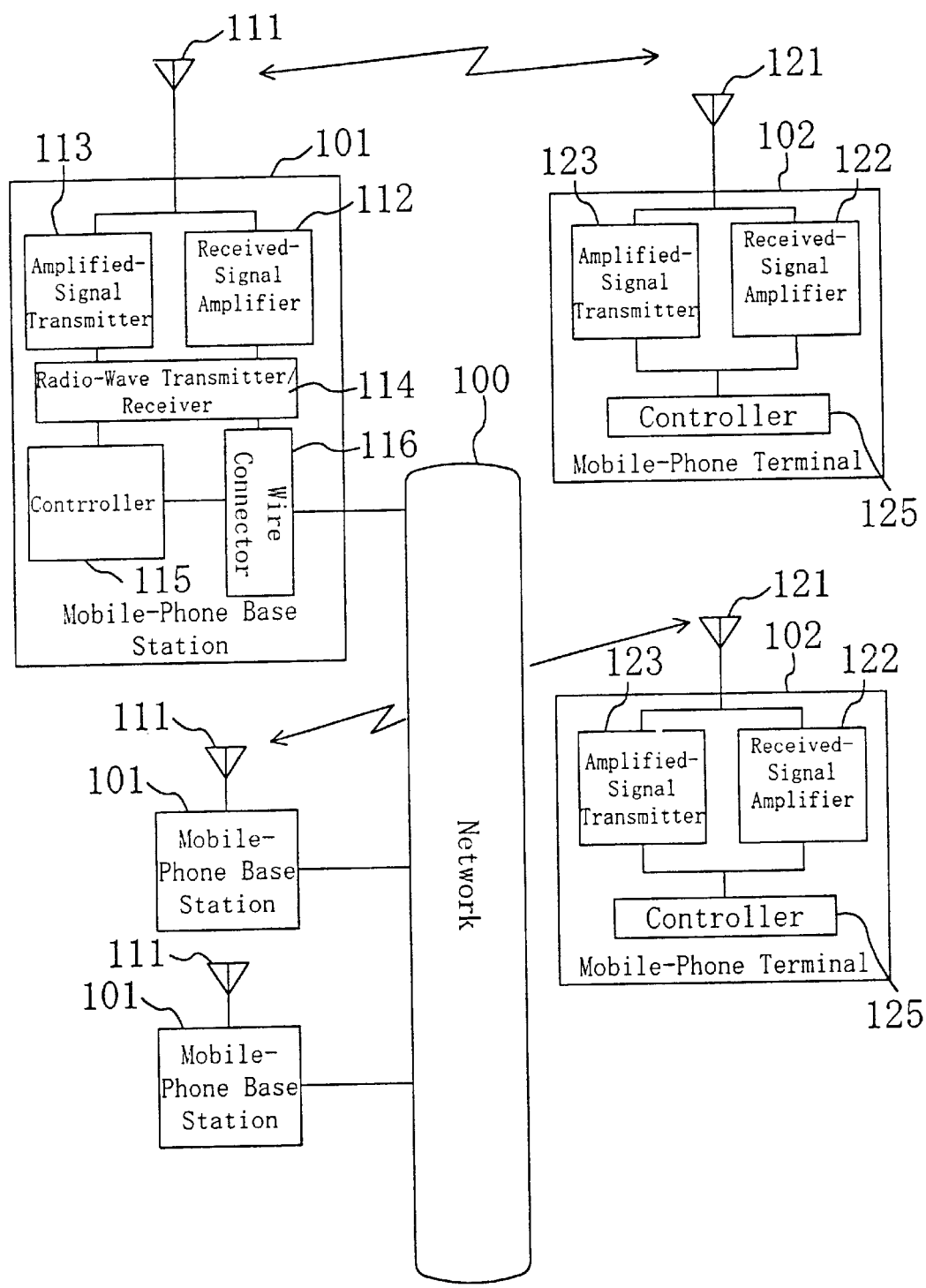
FIG. 1 is a block diagram schematically showing a structure of a communication system in an embodiment of the present invention.

FIG. 1 is a block diagram schematically showing a structure of a communication system in an embodiment of the present invention. As shown in FIG. 1, the communication system of the embodiment comprises: a large number of base stations 101 connected to each other via a network 100; and mobile phone terminals 102 for communicating with each other via the individual base stations 101. Each of the base stations 101 comprises: an antenna device 111 for receiving and transmitting a radio wave; a received-signal amplifier 112 having the function of amplifying a radio signal received at the antenna device 111 and the like; an amplified-signal transmitter 113 for sending an amplified RF signal to the antenna device 111; a radio receiver/transmitter 114 connected to the received-signal amplifier 112 and to the amplified-signal transmitter 113; a controller 115 for controlling the operation of each of the devices; and a wire connector 116 for connecting signals between the base station 101 and the network 100. Each of the mobile phone terminals 102 comprises: a switch 121 for receiving and transmitting a radio wave; a received-signal amplifier 122 having the function of amplifying a radio signal received at the switch 121 and the like; an amplified-signal transmitter 123 for sending an amplified RF signal to the switch 121; and a controller 125 for controlling the operation of each of the devices.

Figure 2:
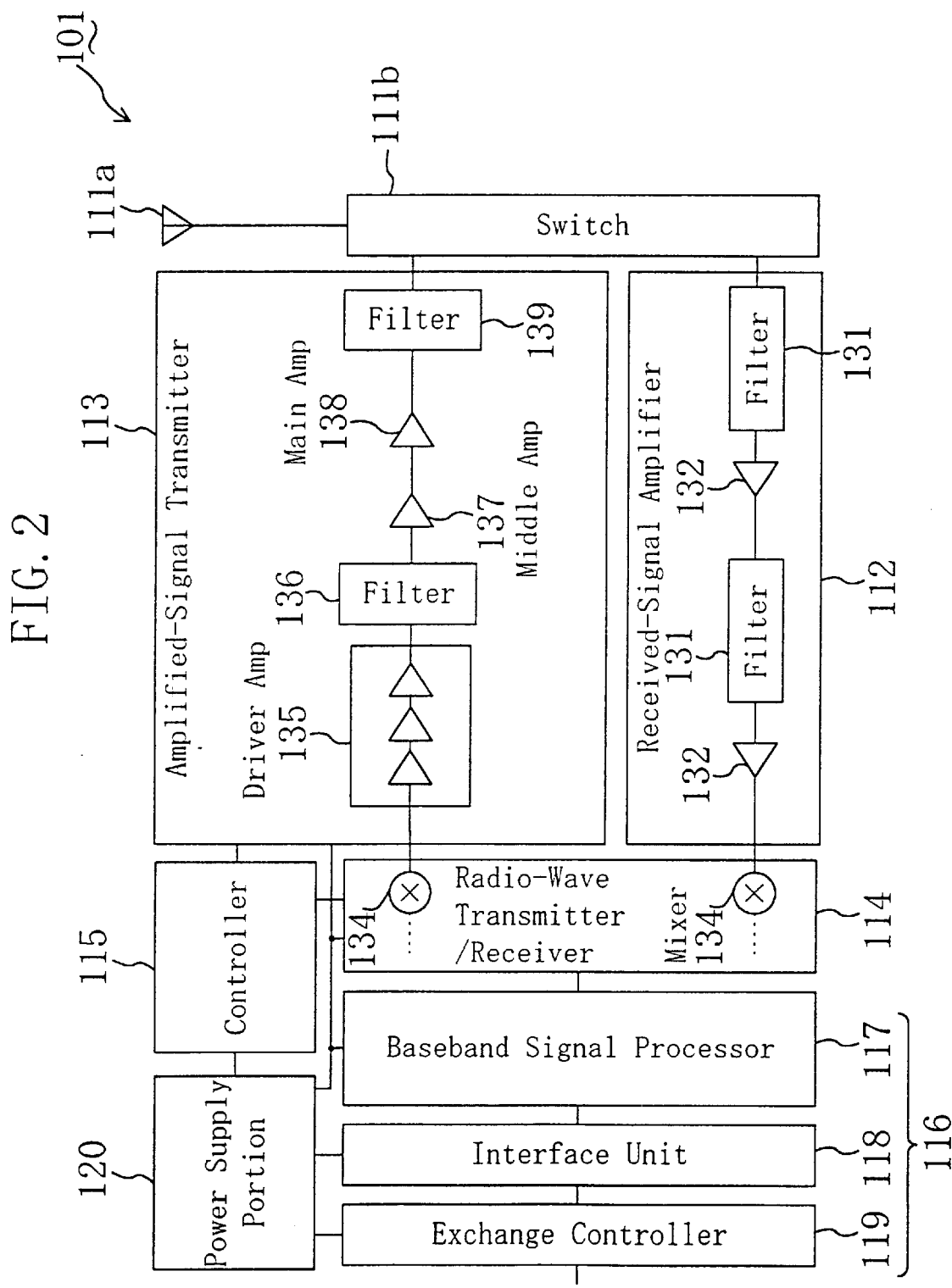
FIG. 2 is a block circuit diagram showing in detail an internal structure of a base station in a communication system in the embodiment.

FIG. 2 is a block circuit diagram showing in detail an internal structure of the base station 101. As shown in the drawing, the antenna device 111 is composed of: an antenna main body 111a; and a switch 111b for switching the antenna main body 111a between transmission and reception. The received-signal amplifier 112 is composed of two filters 131 and two low-noise amplifiers (LNA) 132 disposed in series. A mixer 134 for mixing an output from a local amplifier with an output from an RF transmitter to generate an RF signal is disposed in the radio transmitter/receiver 114. A driver amplifier 135, a filter 136, a middle amplifier 137, and a main amplifier 138 are disposed in the amplified-signal transmitter 113. The wire connector 116 is composed of a baseband signal processor 117 for processing an audio signal, an interface unit 118, and an exchange controller 119 connected to a network 100.

Figure 3:
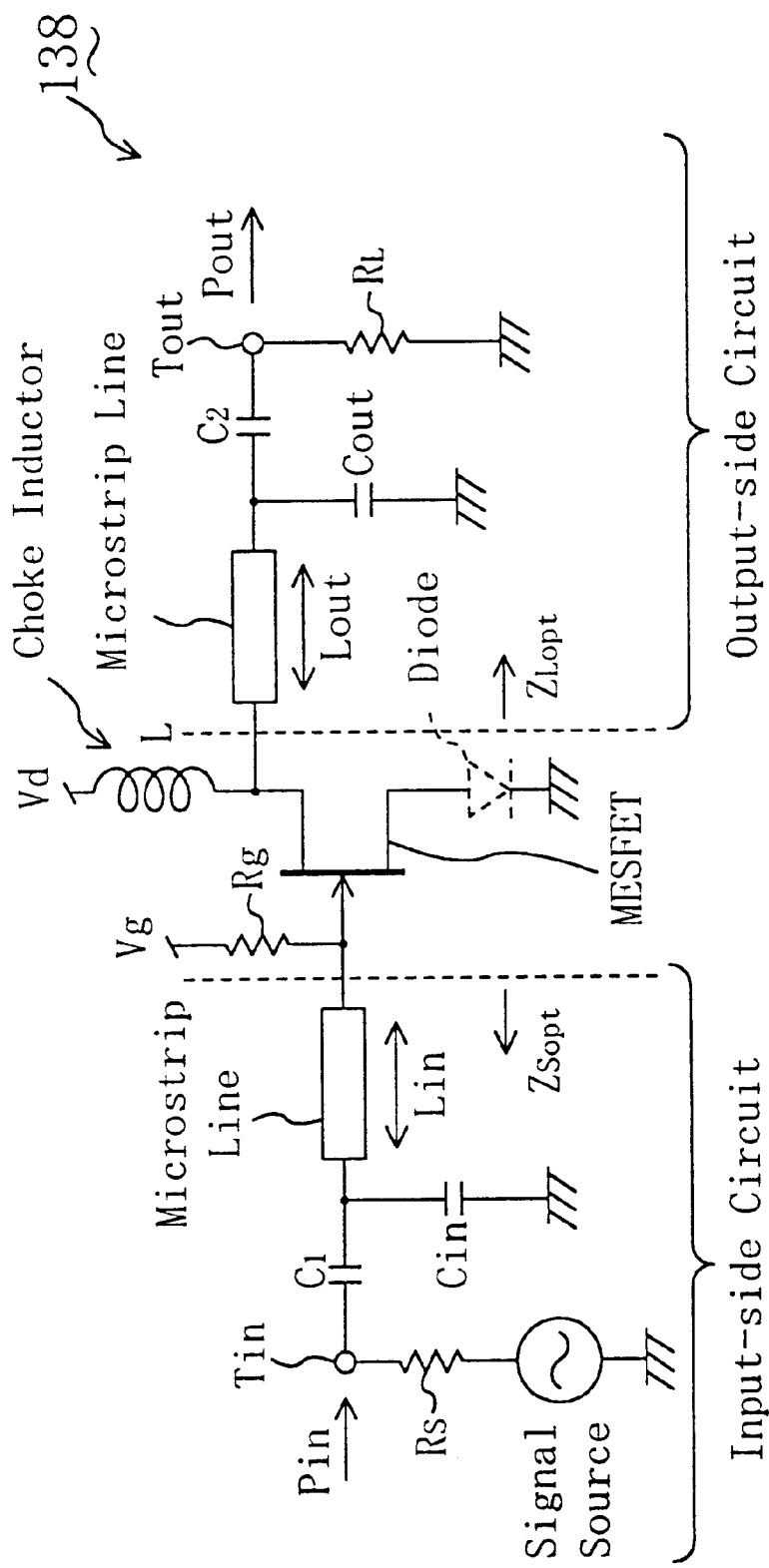
FIG. 3 is an electric circuit diagram showing an exemplary structure of a main amplifier disposed in an amplified-signal transmitter or a received-signal amplifier shown in FIG. 1.

FIG. 3 is an electric circuit diagram showing an exemplary structure of the main amplifier 138 disposed in the amplified-signal transmitter 113 or the received-signal amplifier 112 shown in FIG. 1. As shown in FIG. 3, the main amplifier 138 is composed of a MESFET disposed therein and having a gate for receiving an input signal Pin via an input-side circuit and a drain for outputting an output signal Pout. A gate bias Vg is applied to the gate of the MESFET via a resistor Rg and a power supply voltage Vd is applied to the drain of the MESFET via a choke inductor, while the source of the MESFET is connected to the ground. The input-side circuit is provided with an input terminal Tin for supplying the input signal Pin to the MESFET, a signal supply for supplying electric power to the input terminal Tin via a signal supply resistor $R_S$, and capacitors C1 and Cin and a microstrip line each composing an input-side impedance matching circuit. An output-side circuit is provided with an output terminal Tout for sending an output signal to the outside via the output-side circuit, capacitors C2 and Cout and a microstrip line each composing an output-side impedance matching circuit, and a load resistor $R_L$ interposed between the output terminal Tout and the ground. If a bipolar transistor is used in place of the MESFET, a diode indicated by the broken line may be disposed between the emitter of the bipolar transistor and the ground.

A power amplifier used for communication is required of such characteristics as high efficiency and low distortion. In a typical RF power device, the relationship between efficiency and distortion is a trade-off. In the power amplifier, it is important to increase efficiency, while achieving low distortion. As shown in the drawing, the capacitance value of the capacitor Cin connected in parallel to the microstrip line and the length Lin of the microstrip line are adjusted in the input-side impedance matching circuit such that a reflection coefficient when the MESFET is viewed from the input terminal Pin is minimized. Each of the capacitors C1 and C2 is for blocking a current, which forms a sufficiently low impedance in an RF region. The resistor Rg for supplying the gate bias has been set to a value higher than a gate input impedance such that RF power does not leak. The inductance of the choke inductor L for supplying a drain bias, the capacitances of the capacitors C1 and C2, and the resistance of the resistor Rg do not affect an impedance in the RF region.

EXAMPLE OF SEMICONDUCTOR DEVICE

A description will be given herein below to a semiconductor device formed by integrating active elements such as a transistor and a diode disposed in each of the circuits at the base station 101 with passive elements such as a capacitor and an inductor.

Figure 4:
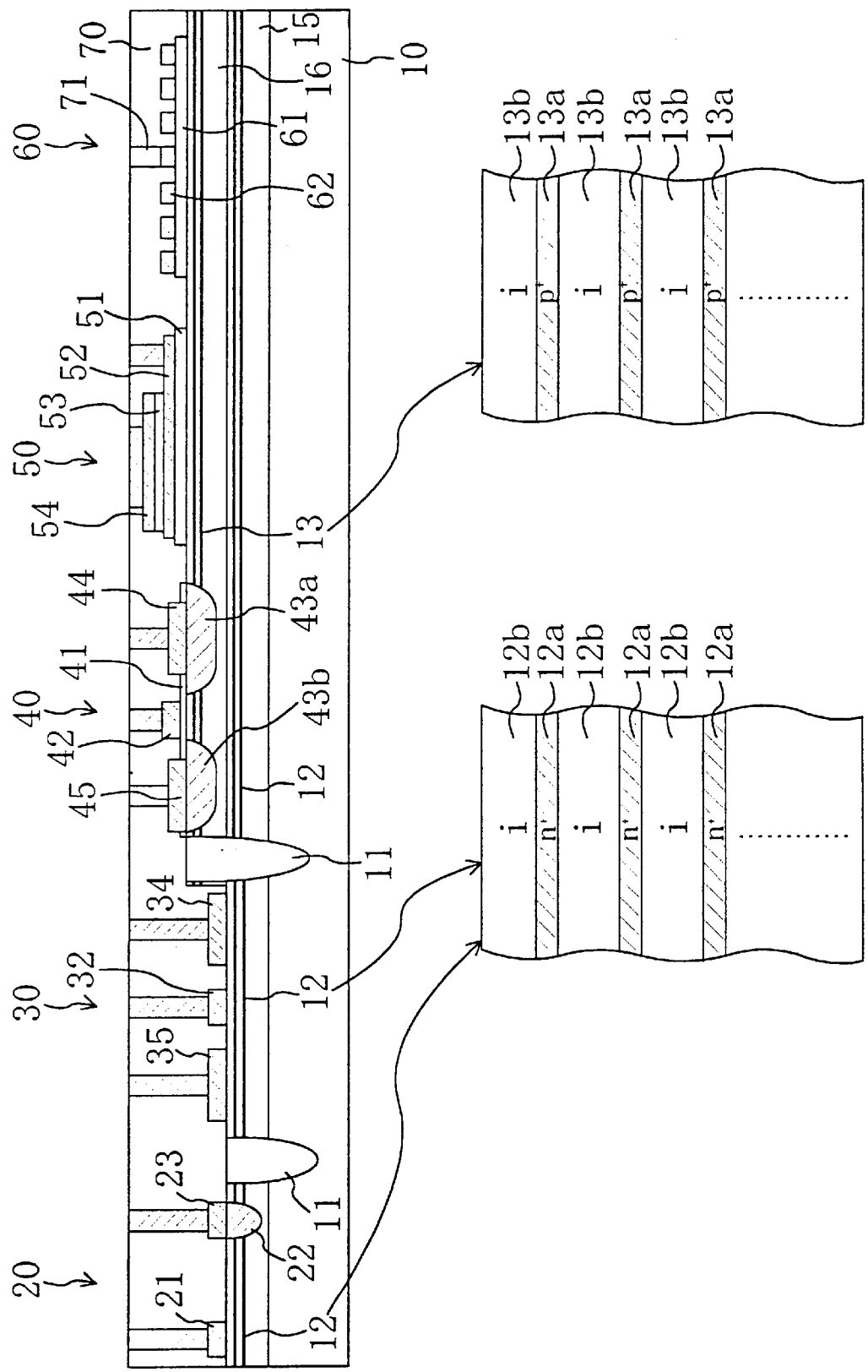
FIG. 4 is a cross-sectional view of a semiconductor device obtained by integrating a Schottky diode, a MESFET, a MOSFET, a capacitor, and an inductor in a SiC substrate in the embodiment.

FIG. 4 is a cross-sectional view of a semiconductor device (semiconductor integrated circuit device) formed by integrating a Schottky diode, a MESFET, a MOSFET, a capacitor, and an inductor in a SiC substrate in the embodiment of the present invention.

In a SiC substrate 10 as a 4H-SiC substrate, a first lightly doped layer 15 containing an n-type impurity (nitrogen) at a low concentration, a first multilayer portion 12 (an active region serving as a carrier flow region) composed of δ-doped layers each containing the n-type impurity (nitrogen) at a high concentration and undoped layers which are alternately stacked, a second lightly doped layer 16 containing a p-type impurity (aluminum) at a low concentration, and a second multilayer portion 13 (an active region serving as the carrier flow region) composed of δ-doped layers each containing the p-type impurity (aluminum) at a high concentration and undoped layers which are alternately stacked are provided upwardly in this order. Each of the second multilayer portion 13 and the second lightly doped layer 16 has a region removed therefrom such that the first multilayer portion 12 is partly exposed at the substrate. Isolation regions 11 composed of a silicon dioxide film buried in trenches are provided to define the multilayer portions 12 and 13 and the lightly doped layers 15 and 16 on a per element basis. Each of the lightly doped layers 15 and 16 may also be formed as an undoped layer.

As shown in the lower part of FIG. 4 under magnification, the first multilayer portion 12 is composed of five n-type doped layers 12a each containing nitrogen at a high concentration (e.g., at $1 \times 10^{18}$ atoms cm$^{-3}$) and having a thickness of about 10 nm and five undoped layers 12b each composed of an undoped 4H-SiC single crystal and having a thickness of about 50 nm, which are alternately stacked. On the other hand, the second multilayer portion 13 is composed of five p-type doped layers 13a each containing aluminum at a high concentration (e.g., at $1 \times 10^{18}$ atoms cm$^{-3}$) and having a thickness of about 10 nm and five undoped layers 13b each composed of the undoped 4H-SiC single crystal and having a thickness of about 50 nm, which are alternately stacked. Each of the n-type doped layers 12a and the p-type doped layers 13a is formed sufficiently thin to allow spreading movement of carriers to the undoped layers 12b and 13b under a quantum effect. As will be described later, an impurity concentration profile in the n-type doped layer or the p-type doped layer has a generally δ-functional configuration relative to the underlying undoped layer. Therefore, the present specification refers to the n-type doped layer 12a and the p-type doped layer 13a as so-called δ-doped layers. The present specification will also refer to a structure consisting of a plurality of heavily doped layers (δ-doped layers) and a plurality of lightly doped layers (undoped layers), which are alternately stacked, as a multiple δ-doped layer.

A Schottky diode (rectifying element) 20 and a MESFET (power amplifier) 30 are provided on that portion of the SiC substrate 10 at which the first multilayer portion 12 exposed. An nMOSFET (switching element) 40, a capacitor (capacitor element) 50, and an inductor (inducing element) 60 are provided on that portion of the SiC substrate 10 having the second multilayer portion 13 located in the uppermost position thereof. In short, the MESFET composing the main amplifier 138 of the amplified-signal transmitter 113 shown in FIG. 13, the diode (the portion indicated by the broken line), the capacitor, the inductor, and the MOSFET disposed in the baseband signal processor 117 or the like shown in FIG. 2 are provided on the single SiC substrate.

The Schottky diode 20 comprises a Schottky electrode 21 composed of nickel (Ni) in Schottky contact with the first multilayer portion 12, a withdrawn electrode layer 22 formed by implanting nitrogen at a high concentration (e.g., about $1 \times 10^{18}$ atoms cm$^{-3}$) into the first multiplayer portion 12, and an ohmic electrode 23 composed of nickel (Ni) in ohmic contact with the withdrawn electrode layer 22.

The MESFET 30 comprises a Schottky gate electrode 32 composed of a Ni alloy film in Schottky contact with the undoped layer 12a serving as the uppermost layer of the first multilayer portion 12 and source and drain electrodes 34 and 35 which are provided on the regions of the first multilayer portion 12 located on both sides of the gate electrode 32 and in ohmic contact with the multilayer portion 12. It is also possible to introduce nitrogen at a high concentration into the regions of the first multilayer portion 12 in contact with the source and drain electrodes 34 and 35.

The nMOSFET 40 comprises a gate insulating film 41 composed of SiO$_2$ formed on the second multilayer portion 13, a gate electrode 42 composed of a Ni alloy film formed on the gate insulating film 41, n-type source and drain regions 43a and 43b formed by implanting nitrogen at a concentration of $1 \times 10^{18}$ cm$^{-3}$ into the regions of the second multilayer portion 13 located on both sides of the gate electrode 42, and source and drain electrodes 44 and 45 composed of an Ni alloy film in ohmic contact with the source and drain regions 43a and 43b, respectively. It will easily be appreciated that a pMOSFET can also be provided in a certain region of the first multilayer portion 12 by forming an insulating gate electrode, p-type source/drain regions, and the like.

The capacitor 50 comprises an underlying insulating film 51 composed of a SiN film provided on the second multilayer portion 13, a lower electrode 52 composed of a platinum (Pt) film provided on the underlying insulating film 51, a capacitor insulating film 53 composed of a high dielectric film such as BST provided on the lower electrode 52, and an upper electrode 54 composed of a platinum (Pt) film opposed to the lower electrode 52 with the capacitor insulating film 53 interposed therebetween.

The inductor 60 comprises a dielectric film 61 composed of a SiN film provided on the first multilayer portion 13 and a conductor film 62 composed of a spiral Cu film formed on the dielectric film 61. The conductor film 62 has a width of about 9 μm and a thickness of about 4 μm. The spacing between the conductor films 62 is about 4 μm. However, since the SiC substrate has a high heat resistance and a high heat conductivity, the conductor film 62 can be scaled down depending on an amount of current into a miniaturized pattern, e.g., a configuration with a width of about 1 to 2 μm and a spacing of about 1 to 2 μm.

An interlayer insulating film 70 composed of a silicon dioxide film is also formed on the substrate. Wires (not shown) composed of an aluminum alloy film, a Cu alloy film, or the like are provided on the interlayer insulating film 70. The elements 20, 30, 40, 50, and 60 have respective conductor portions connected to the wires via contacts 71 composed of an aluminum alloy film buried in contact holes formed in the interlayer insulating film 70, whereby circuits at individual base stations are constructed as shown in FIG. 2. However, it is unnecessary for all the circuits shown in FIG. 2 to be provided on a single SiC substrate. Any of the elements may also be provided on another substrate (silicon substrate). For example, although the amplified-signal transmitter and the received-signal amplifier, each requiring a power element, are provided on the SiC substrate, the baseband processor which does not require a power element may also be provided on a silicon substrate.

In the present embodiment, principal ones of the devices at the base station 101 are mounted on a single SiC substrate so that a required circuit is scaled down, as shown in FIG. 4. Accordingly, each of the circuits at the base station 101 in the present embodiment can be scaled down (e.g., the whole circuit shown in FIG. 2) and the total thickness of the circuits is only on the order of the sum of the thickness of the SiC substrate and the respective thicknesses of the multilayer film and the interlayer insulating film so that the whole base station 101 has an extremely thin structure. In other words, the size of the base station 101 itself can be reduced. In particular, integration is facilitated since the MESFET, the Schottky diode, the MOSFET, and the like can be provided on the single SiC substrate by forming the Schottky diode into a lateral configuration, as shown in FIG. 4. A further size reduction is achievable by mounting even passive elements such as an inductor and a capacitor on the common SiC substrate.

Since a temperature range which ensures normal operation of the MESFET and the Schottky diode formed on the SiC substrate is around 400° C., various constraints resulting from a low upper-limit temperature of 150° C. as placed in the case where a conventional FET provided on a Si substrate is assumedly used are eased remarkably. That is, even if all the elements are positioned in close proximity, the present embodiment seldom encounters problems associated with heat resistance because the MESFET and Schottky diode on the SiC substrate are high in heat resistance. Since the circuit can be scaled down significantly, placement flexibility at the base station is held high. Since the SiC substrate has a high heat conductivity and an excellent heat releasing property, the elements within the circuit can easily be prevented from being adversely affected by heat dissipation from the power amplifier.

As a result, there is provided a semiconductor device having the characteristics of high power and a high breakdown voltage and suitable for use at a base station or mobile station in a communication system. In the case where the semiconductor device is placed at the base station, it can withstand a long-term use without the provision of a cooling device having a particularly high cooling ability because of the high heat resistance of the SiC substrate. This reduces placement cost for cooling facilities and running cost for power and the like. In the case where the semiconductor device is placed at the mobile station, even if the MESFET is placed in close proximity to a heat-generating element such as an inductor, such degradation of characteristics as caused by a temperature rise when the GaAs substrate is used can be suppressed. This eases constraints on the placement of the semiconductor device at the mobile station and scales down the whole mobile station.

By integrating a majority of elements in a base station or mobile station into a common SiC substrate, the labor of assembling parts can be saved and the fabrication cost for the semiconductor device can be reduced. Because the element having the multilayer portion composed of the δ-doped layers and the lightly doped layers which are arranged in stacked relation increases the reliability of the device, a higher production yield can also be expected so that a cost reduction due to the higher production is achieved.

If the semiconductor device is applied to equipment handling an RF signal on the GHz order, in particular, the dielectric film 61 of the inductor 60 is preferably composed of a BCB (benzocyclobutene) film. The BCB film is a film containing BCB in the structure thereof, which is obtained by dissolving a BCB-DVS monomer in a solvent, applying the resulting solution, and baking the applied solution. The BCB film features a relative dielectric constant as low as about 2.7 and easy formation of a film as thick as about 30 μm by a single step of application. Since the tan δ of the BCB film is about 0.006 at 60 GHz, which is lower than that of $SiO_2$ by one order of magnitude, the BCB film has particularly excellent characteristics as the dielectric film composing the inductor and the microstrip line.

Multiple δ-Doped Layer

As stated previously, the semiconductor device according to the present embodiment comprises the multilayer portion (multiple δ-doped layer) composed of the n-type or p-type doped layers 12a or 13a and the undoped layers 12b or 13b which are alternately stacked. Such a structure composed of heavily-doped layers (δ-doped layers) and lightly doped layers (undoped layers) which are alternately stacked is obtainable by using the crystal growing apparatus and the crystal growing method disclosed in the specifications and drawings of Japanese Patent Applications 2000-58964, 2000-06210, and the like, which will be described later. Specifically, an epitaxial growing method using in-situ doping is used by simultaneously effecting the supply of a dopant gas using a pulse valve (termed pulse doping) and the supply of a raw-material gas.

Figure 5:
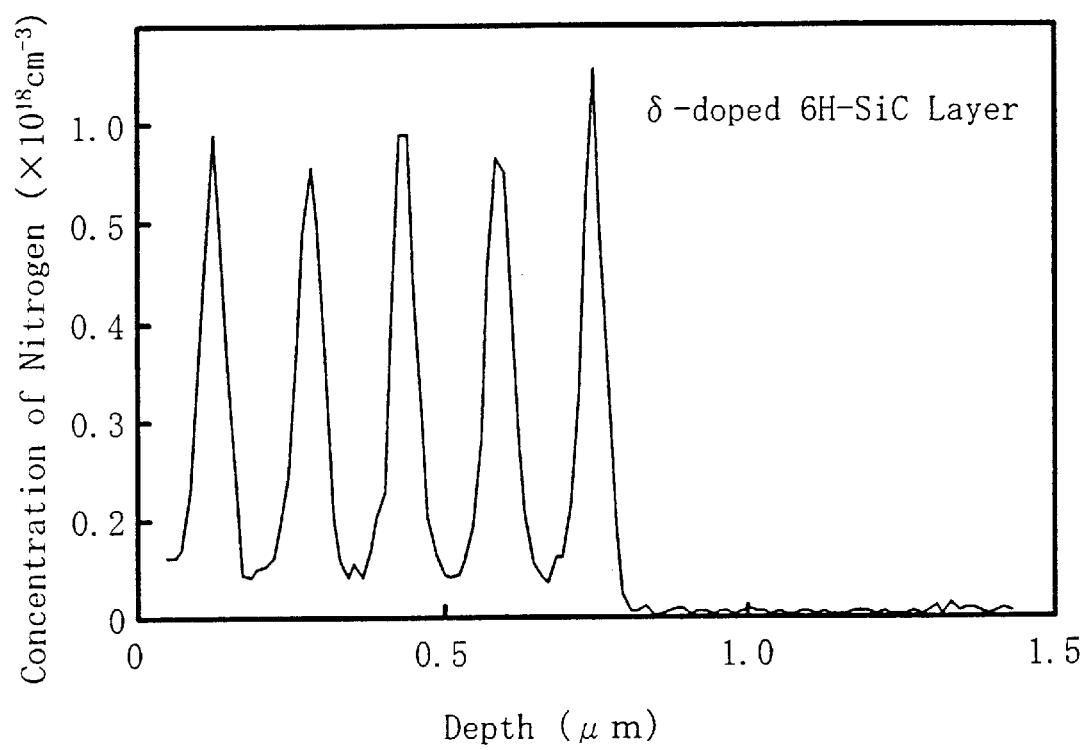
FIG. 5 shows the distribution of a dopant concentration along the depth of an active region formed in the embodiment.

FIG. 5 shows the distribution of a dopant concentration along the depth of the multiple δ-doped layer (corresponding to the multilayer portion 12 or 13) which is an active region formed in the present embodiment. As described above, the period (pulse width) during which a pulse valve is open during the formation of the n-type doped layer is adjusted to 102 μs and the period during which the pulse valve is closed (interval between pulses) is adjusted to 4 ms. The concentration profile of FIG. 5 was obtained as a result of measurement performed by using a secondary ion mass analyzer (SIMS). In FIG. 5, the horizontal axis represents a depth (μm) from the uppermost surface of the substrate) and the vertical axis represents the concentration of nitrogen as the dopant. As shown in the drawing, the concentration of nitrogen (N) in each of the n-type doped layers 12a formed in accordance with the method of the present embodiment is nearly uniform (about $1 \times 10^{18}$ atoms $cm^{-3}$) and the impurity concentration changes extremely sharply in each of the region in which the undoped layer 12a shifts to the n-type doped layer 12b and the region in which the n-type doped layer 12b shifts to the undoped layer 12a. The peak concentration of nitrogen shown in FIG. 5 is about $1 \times 10^{18}$ atoms $cm^{-3}$ since the data shown in FIG. 5 was obtained from the doped layer formed by adjusting the period (pulse width) during which the pulse valve is open to 102 μs, while allowing a nitrogen gas as a dopant gas to flow. However, it is possible to increase the peak concentration of nitrogen to about $1 \times 10^{19}$ atoms $cm^{-3}$ by adjusting the period (pulse width) during which the pulse valve is open to about 110 μs. By allowing a nitrogen gas as a carrier gas to flow, it is also possible to easily adjust the concentration of nitrogen in the undoped layer to about $1 \times 10^{16}$ atoms $cm^{-3}$. By allowing the carrier gas to flow and supplying nitrogen at a certain flow rate even to the undoped layer, the concentration of nitrogen in the undoped layer can be adjusted stably and advantageously to a constant value.

Although the data shown in FIG. 5 was obtained from the n-type doped layer 12a, a similar impurity concentration profile is obtainable even from a p-type doped layer containing aluminum or the like as a dopant. As shown in FIG. 5, the impurity concentration profile in the n-type or p-type doped layer has a generally δ-functional configuration relative to the underlying undoped layer.

Figure 6A:
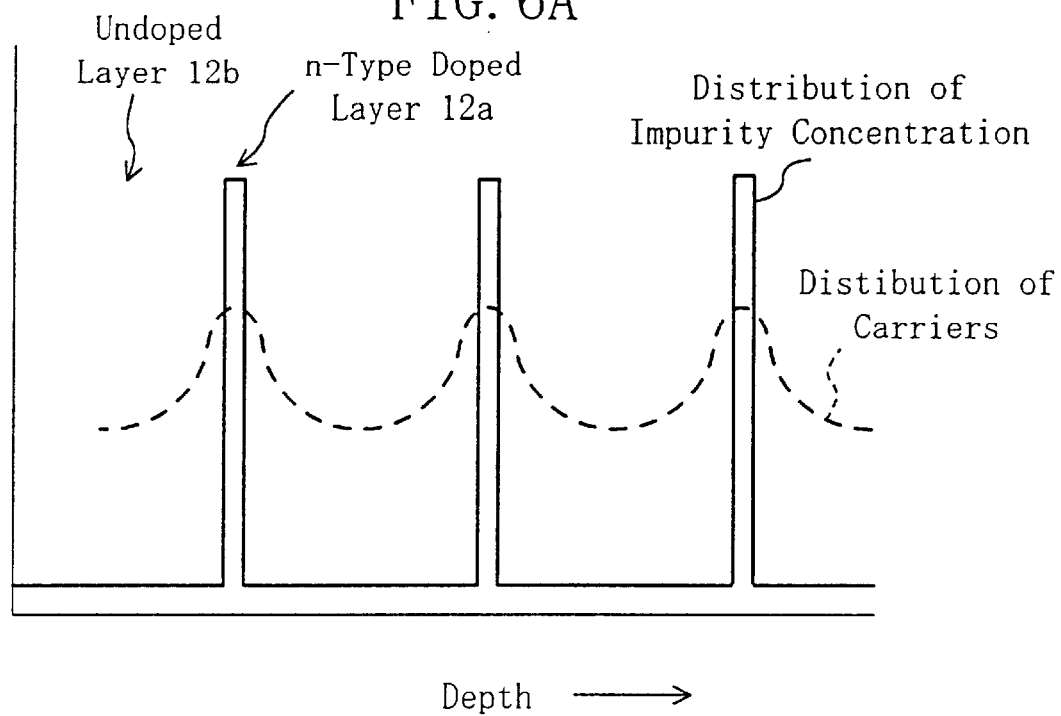
FIG. 6A diagrammatically shows the relationship between the concentration profile of nitrogen and the distribution of carriers along the depth of a first multilayer portion in the embodiment and FIG. 6B is a partial band diagram showing the configuration of a conduction band edge along the depth of the first multilayer portion.
Figure 6B:
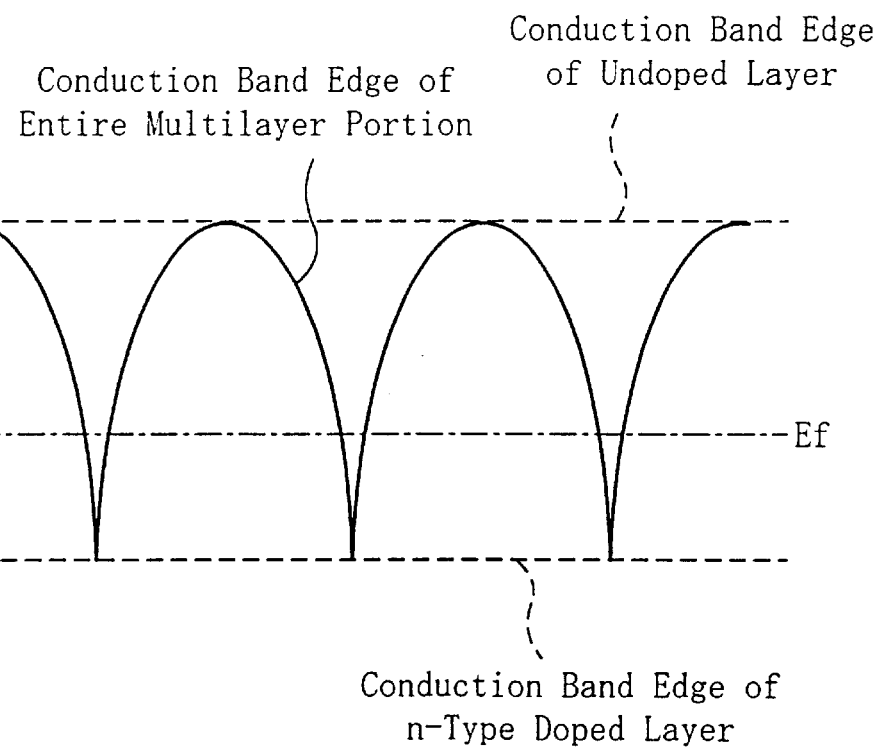

FIG. 6A diagrammatically shows the relationship between the concentration profile of nitrogen as an n-type impurity and the distribution of carriers along the depth of the first multilayer portion 12 as the multiple δ-doped layer in the present embodiment. FIG. 6B is a partial band diagram showing the configuration of a conduction band edge along the depth of the first multilayer portion 12. It is to be noted that the model shown in FIG. 6A and FIG. 6B was produced by adjusting the concentration of nitrogen in the undoped layer 12b (lightly doped layer) to $5 \times 10^{15}$ atoms cm$^{-3}$ without using a nitrogen as a carrier gas, adjusting the pulse width of the pulse valve to about 102μs, and thereby adjusting the concentration of nitrogen in the n-type doped layer 12a (heavily doped layer) to $1 \times 10^{18}$ atom·cm$^{-3}$. Although FIG. 6A and FIG. 6B show the structure of the multiple δ-doped layer and the state of carrier distribution therein by using the first multilayer portion 12 as an example, the second multilayer portion 13 also has the same structure and the same state of carrier distribution. Accordingly, the same effects as observed in the first multilayer portion 12, which will be described below, are also observable in the second multilayer portion 13.

Since the thickness of each of the n-type doped layers 12a is as thin as about 10 nm as shown in FIG. 6A and FIG. 6B, a quantum level resulting from a quantum effect occurs in the n-type doped layer 12a so that the wave function of an electron present locally in the n-type doped layer 12a expands to a certain degree. What results is a state of distribution in which carriers are present not only in the n-type doped layers 12a but also in each of the undoped layers 12b at a concentration higher than an original concentration, as indicated by the broken curve in the drawing. In the state in which the potential of the first multilayer portion 12 is increased and carriers flow, electrons are constantly supplied to the n-type doped layers 12a and to the undoped layers 12b. What results is the state of distribution in which electrons are present not only in the n-type doped layers 12a but also in each of the undoped layers 12b at a relatively high concentration. Since electrons flow not only in the n-type doped layers 12a but also in the undoped layers 12b, the resistance of the first multilayer portion 12 is reduced. This reduces scattering by impurity ions in the undoped layers 12b and thereby achieves a particularly high electron mobility in each of the undoped layers 12b.

In the state in which the entire first multilayer portion is depleted, on the other hand, carriers no more exist in the undoped layers 12b and in the n-type doped layers 12a so that a breakdown voltage is defined by the undoped layers 12b each having a lower impurity concentration and the whole multilayer portion 12 has a high breakdown voltage.

The foregoing fundamental effects are achievable not only when a plurality of δ-doped layers are present in the carrier flow region but also when a single δ-doped layer is present therein. If at least one δ-doped layer is present in the carrier flow region serving as a depletion layer when a voltage at which the device operates is applied, carriers spread out from the δ-doped layer to the adjacent undoped layer (lightly doped layer) so that the carriers flow in the region reached by the carriers from the undoped layer, so that a low resistance is obtainable under the foregoing effect. If the device is in the OFF state, on the other hand, the δ-doped layer is also depleted so that a high breakdown voltage is obtained. Thus, if at least one δ-doped layer is present in the carrier flow region when a voltage at which the device operates (set ON voltage) is applied, both the low resistance and the high breakdown voltage can be achieved at the same time.

Each of the foregoing effects are similarly achievable even if holes, not electrons, are used as carriers.

As shown in FIG. 6B, a conduction band edge in the whole first multilayer portion 12 presents a configuration which connects a conduction band edge in the n-type doped layer 12a (δ-doped layer) indicated by the broken line to a conduction band edge in the undoped layer 12b indicated by the broken line. Although it is normal to increase the impurity concentration in the n-type doped layer 12a to a value at which the conduction band edge therein is lower than the Fermi level $E_f$, the impurity concentration in the n-type doped layer 12a need not necessarily be increased to such a high value. In the second multilayer portion 13 also, the relationship between the Fermi level $E_f$ and a valence band edge in the δ-doped layer is represented by a configuration obtained by replacing the conduction band edge with a valence band edge in FIG. 6B and vertically inverting the whole diagram.

By using the first and second multilayer portions 12 and 13 (multiple δ-doped layers) having such structures as the carrier flow region, a high-performance device as will be shown in each of the following embodiments is obtainable. As for the function of the δ-doped layers and the undoped layers serving as the carrier flow region in the multilayer δ-doped layers, it will be described in each of the following embodiments.

Although the present embodiment has used nitrogen to form the n-type doped layer, a doping gas containing another element (e.g., phosphorus (P), arsenic (As), or the like) as a dopant exhibiting n-type conductivity may also be used instead.

Although the present embodiment has used aluminum to form the p-type doped layer, a doping gas containing another element (e.g., boron (B), gallium (Ga), or the like) as a dopant exhibiting p-type conductivity may also be used instead.

Although the present embodiment has formed the δ-doped layer on the undoped layer, it is also possible to use an n-type lightly doped layer or a p-type lightly doped layer formed by opening the pulse valve instead of the undoped layer.

Although the present embodiment has described the structure in which the multilayer portions each composed of the undoped layers (lightly doped layers) and the δ-doped layers (heavily doped layers) which are provided in stacked relation on the silicon carbide substrate (SiC substrate), the structure of the multilayer portions according to the present invention may also be provided on a substrate made of a material other then SiC. In particular, a substrate made of GaAs, GaN, or the like has such a wide band gap as to be termed a semi-insulating material substrate, it is advantageous in that a high-break-down-voltage device can be formed therefrom by applying the present invention thereto.

Although the present embodiment has described the CVD method using induced heating as a method for growing a thin film on a base material, it will easily be appreciated that the thin-film growing method according to the present invention is effective even when a thin film is grown on the base material under the effects achieved by any of plasma CVD, photo assisted CVD, and electron assisted CVD.

The present invention is also applicable to a multilayer structure composed of lightly doped layers (including undoped layers) and heavily doped layers thinner than the lightly doped layers to a degree which allows carriers to spread out to the lightly doped layers under a quantum effect by using not only CVD but also another technique such as sputtering, vapor deposition, or MBE.

Experimental Data

A description will be given herein below to the relationship between the thickness of the multiple δ-doped layer and the effects achieved thereby based on experimental examples disclosed in a PCT application (PCT/JP00/01855) by the present inventors.

Figure 7A:
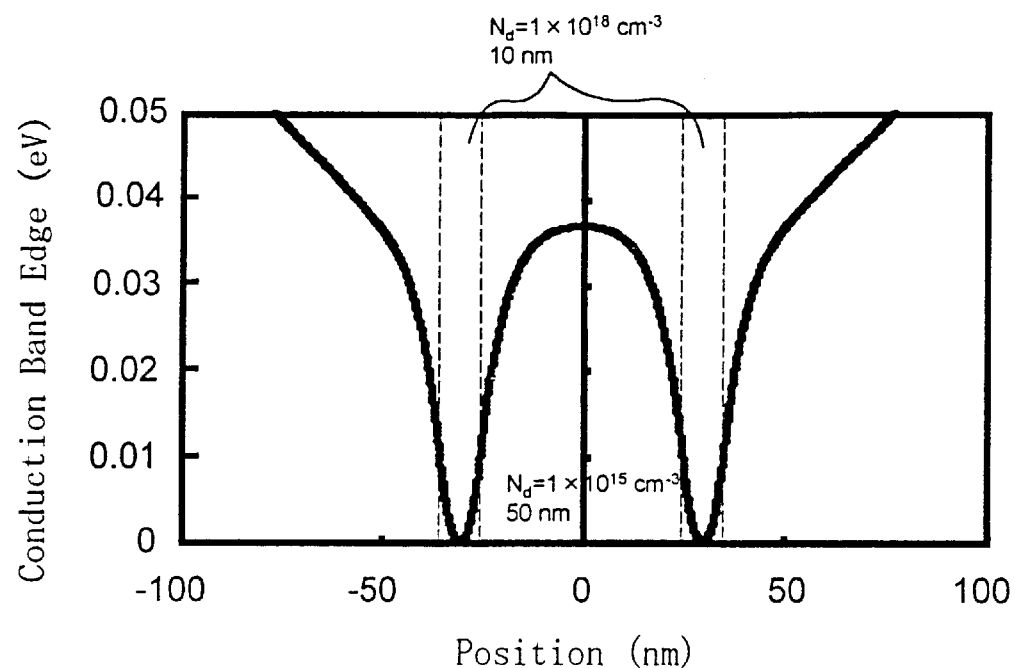
FIG. 7A shows the result of simulating a band structure at a conduction band edge in a sample A having a δ-doped layer with a thickness of 10 nm and FIG. 7B shows the result of simulating the distribution of carrier concentration.
Figure 7B:
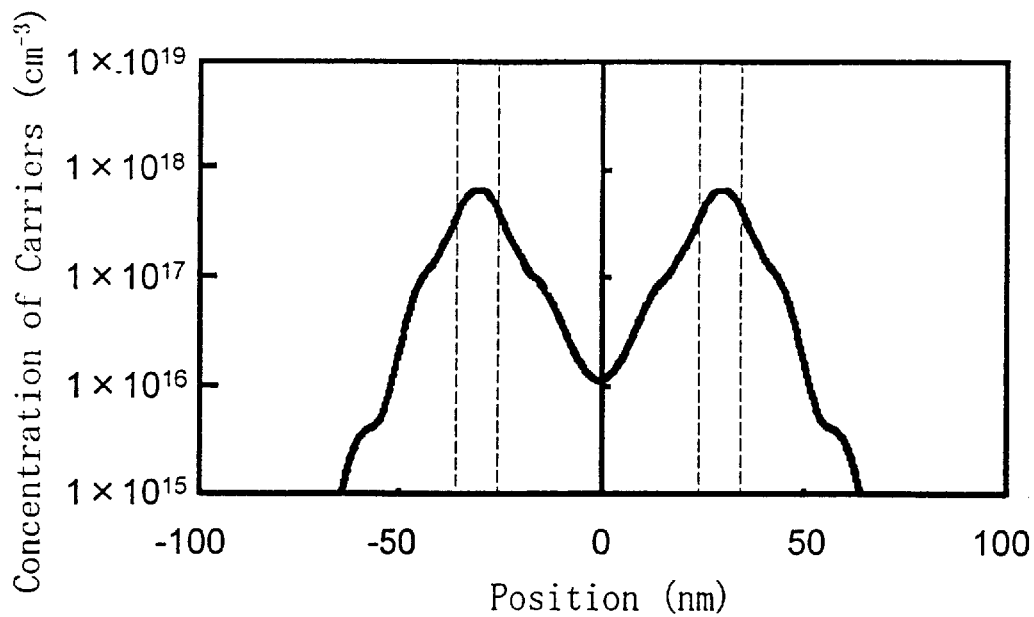
Figure 8A:
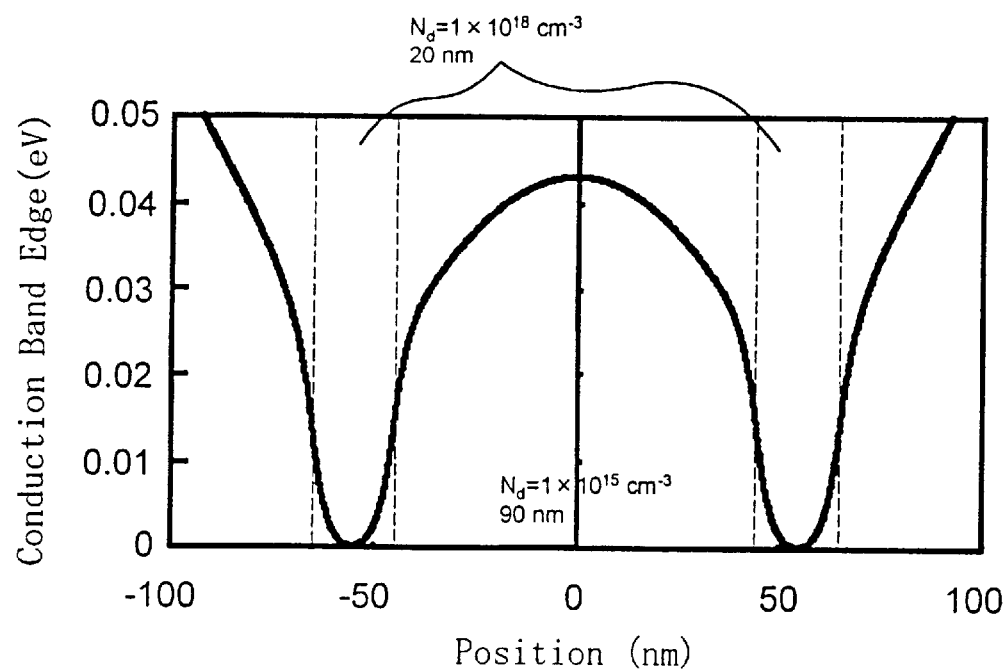
FIG. 8A shows the result of simulating a band structure at a conduction band edge in a sample B having the δ-doped layer with a thickness of 20 nm and FIG. 8B shows the result of simulating the distribution of carrier concentration.
Figure 8B:
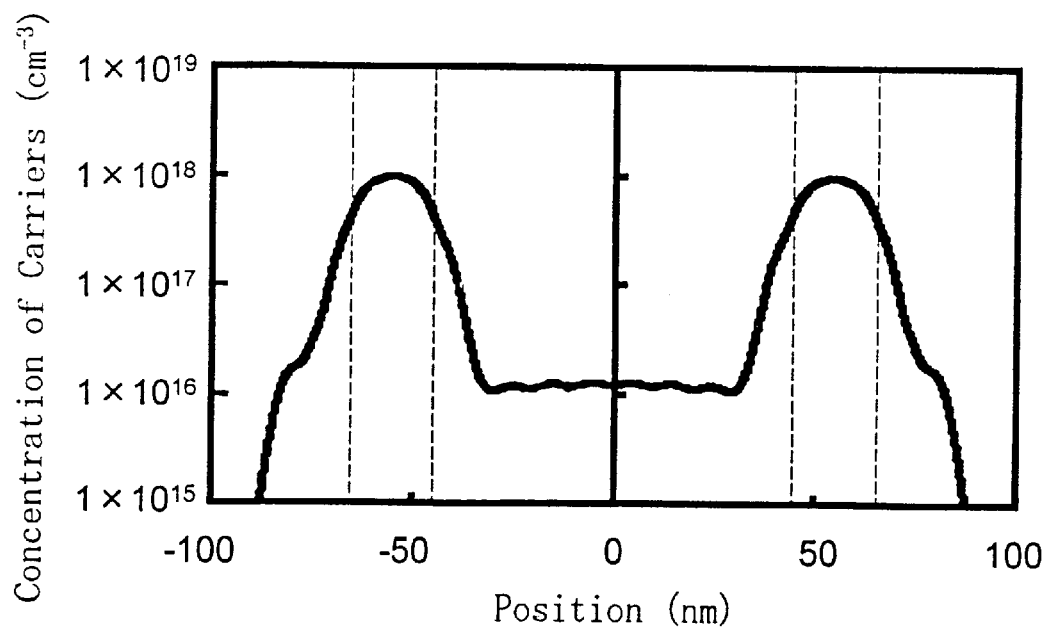

FIG. 7A shows the result of simulating a band structure at a conduction band edge in a sample A having a multilayer portion composed of five δ-doped layers each having a thickness of 10 nm and five undoped layers each having a thickness of 50 nm which are alternately stacked. FIG. 7B shows the result of simulating the distribution of carrier concentration. FIG. 8A shows the result of simulating a band structure at a conduction band edge in a sample B having a multilayer portion composed of five δ-doped layers each having a thickness of 20 nm and five undoped layers each having a thickness of 50 nm which are alternately stacked. FIG. 8B shows the result of simulating the distribution of carrier concentration. As shown in FIG. 7A and FIG. 8A, electrons are confined to a V-shaped Coulomb potential (quantum well) sandwiched between donor layers each positively charged in a cross section orthogonally intersecting the δ-doped layers and a quantum state is formed within the well. The effective mass of an electron is 1.1 and the relative dielectric constant of the 6H-SiC layer is 9.66. A background carrier concentration in the 6H-SiC layer used as the undoped layer is $5 \times 10^{15}$ cm$^{-3}$ and the density of carriers in the n-type δ-doped layer is $1 \times 10^{18}$ cm$^{-3}$.

As shown in FIG. 7B, two-dimensional electrons are distributed extensively even in the undoped layer sandwiched between the two δ-doped layers (sample A) each having a thickness of 10 nm and the region in which the concentration of electrons is $2 \times 10^{16}$ cm$^{-3}$ or more is observed in the range at 25 nm from the interface. This indicates that the distribution of carriers shown in FIG. 7B is coincident with the state of carrier distribution diagrammatically depicted in FIG. 6A and that carriers have spread out from the δ-doped layers to the undoped layer.

On the other hand, a large overlapping portion exists between a region in which the probability of presence of a carrier defined by the wave function of an electron is high and each of the δ-doped layers (sample B) having a large thickness of 20 nm and the center of ionized impurity scattering so that the region in which the electron concentration is $2 \times 10^{16}$ cm$^{-3}$ or more is at 11 nm from the interface, as shown in FIG. 8B. This indicates that a relatively small number of carriers have spread out from the δ-doped layers to the undoped layers. In this case also, however, the fundamental effects achieved by the multiple δ-doped layer according to the present invention are achievable if the minimum value of the carrier concentration in the region between the δ-doped layers is higher than the original carrier concentration in the undoped layer. The effects achieved by the spreading out of carriers can be adjusted appropriately by adjusting the impurity concentration and film thickness of each of the δ-doped layers and the undoped layers.

Since the present embodiment has provided, on the SiC substrate 10, the first and second multilayer portions 12 and 13 having the structure shown in the lower part of FIG. 4, the following remarkable effects are achievable in each of the elements.

Schottky Diode

First in the Schottky diode 20, carriers in the n-type doped layers 12a are so distributed as to spread out even to the undoped layers 12b under a quantum effect. If a forward bias is applied to the Schottky diode 20 in this state, the potential of the first multilayer portion 12 is increased and electrons are constantly supplied to the n-type doped layers 12a and to the undoped layers 12b, so that a current easily flows in the Schottky electrode 21 through the n-type doped layers 12a and undoped layers 12b of the first multilayer portion 12. In short, not only the n-type doped layers 12a of the first multilayer portion 12 but also the undoped layers 12b thereof function as the carrier flow region. Since the impurity concentration in each of the undoped layers 12b is low, impurity scattering is reduced in the undoped layers 12b. This retains a low resistance, while achieving low power consumption and a large electric current. If a reverse bias is applied to the Schottky diode 20, on the other hand, the depletion layer expands from the undoped layers 12b of the first multilayer portion 12 to the n-type doped layers 12a thereof so that the entire first multilayer portion 12 is depleted easily and a high breakdown voltage is obtained. Accordingly, a power diode with high power and a high breakdown voltage can be implemented.

A detailed description will be given herein below to the effects of the lateral Schottky diode according to the present embodiment in comparison with those of the conventional vertical Schottky diode.

FIG. 9A1 to FIG. 9C3 are energy band diagrams each showing changes in the configuration of a conduction band edge caused by changes in bias in the Schottky diode according to the present embodiment and in the conventional Schottky diode. FIG. 9A1, FIG. 9B1, and FIG. 9C1 show conduction band edges in the undoped layer 12b of the Schottky diode according to the present embodiment. FIG. 9A2, FIG. 9B2, and FIG. 9C2 show conduction band edges in the n-type doped layer 12a of the Schottky diode according to the present embodiment. FIGS. 9A3, 9B3, and 9C3 show conduction band edges in the SiC substrate of the conventional Schottky diode. It is to be noted that the conventional Schottky diode is assumed to have a vertical configuration in which a uniformly doped layer doped with nitrogen at a uniform concentration is in contact with the Schottky electrode and an ohmic electrode is in ohmic contact with any portion of the uniformly doped layer. FIG. 9A1 to FIG. 9A3 show the configurations of the conduction band edges when no voltage is applied between the Schottky electrode and the ohmic electrode (zero bias). FIG. 9B1 to FIG. 9B3 show the configurations of the conduction band edges when a voltage is applied between the Schottky electrode and the ohmic electrode such that the Schottky electrode has a higher voltage (forward bias). FIG. 9C1 to FIG. 9C3 show the configurations of the conduction band edges when a voltage is applied between the Schottky electrode and the ohmic electrode such that the ohmic electrode has a higher voltage (reverse bias). Since the state of contact between the ohmic electrode and the first multilayer portion 12 does not essentially change in response to a change in bias, the depiction thereof is omitted. Since the present embodiment has described the case where the n-type semiconductor layer in which electrons flow as carriers is provided, the depiction of the configuration of a valence band edge is omitted.

As shown in FIG. 9A1 to FIG. 9A3, respective high Schottky barriers (about 1 to 2 eV) are formed between the undoped layer or the n-type doped layer in the active region and the Schottky electrode and between the uniformly doped layer and the Schottky electrode in the state of zero bias in each of the Schottky diode of the present embodiment and the conventional Schottky diode.

When a forward bias is applied to the Schottky diode of the present embodiment, the potential of the first multilayer portion 12 is increased, as shown in FIG. 9B1 and FIG. 9B2. In other words, the energy level at a conduction band edge in each of the undoped layer 12b of the first multilayer portion 12 and in the n-type doped layer 12a thereof is increased. Since a distribution of carriers as shown in FIG. 6A is formed also in the undoped layer 12b, a current easily flows in the Schottky electrode 21 through the n-type doped layers 12a and the undoped layers 12b in the first multilayer portion 12. In short, not only the n-type doped layers 12a of the first multilayer portion 12 but also the undoped layers 12b thereof function as the carrier flow region. Although a distribution of carriers as shown in FIG. 6A is formed in the undoped layer 12b, the impurity concentration therein is low so that impurity scattering is reduced in the undoped layer 12b. This maintains the resistance of the whole first multilayer portion 12 at a high value and achieves lower power consumption and a large electric current.

On the other hand, if a forward bias is applied to the conventional Schottky diode as shown in FIG. 9B3, a current flows from the uniformly doped layer to the Schottky electrode.

If a reverse bias is applied to the Schottky diode according to the present embodiment as shown in FIG. 9C1 and FIG. 9C2, the overall energy level at the conduction band edge in the undoped layers 12b of the first multilayer portion 12 and in the n-type doped layers 12a thereof lowers. Thus, the breakdown voltage is defined by an electric field applied to the depletion layer in the reverse bias state. In that case, the slope of the conduction band edge is gentler as the impurity concentration is lower so that the width of the depletion layer is naturally wider as the impurity concentration is lower. Accordingly, a high breakdown voltage is obtained in the undoped layer 12b as shown in FIG. 9C1. If the heavily doped layer and the Schottky electrode are in mere contact, the conduction band edge in the heavily doped layer in the reverse bias state is as indicated by the broken curve in FIG. 9C2 and the width of the depletion layer in the heavily doped layer is reduced significantly. However, since the thickness of the n-type doped layer 12a is as small as 10 nm in the present embodiment, the depletion layer expands from the undoped layer 12b into the n-type doped layer 12a as indicated by the solid curve in FIG. 9C2, so that movement of electrons is impossible.

If the whole first multilayer portion 12 is depleted, carriers are not distributed in the undoped layer 12b. For an electric current to flow from the Schottky electrode 21 to the withdrawn doped layer 22, therefore, the electric current should flow only in the n-type doped layer 12a. However, since the thickness of the n-type doped layer 12a is as small as 10 nm, the electric current experiences a high resistance in the n-type doped layer 12a and does not flow actually. In short, substantially no ohmic contact is provided between the n-type doped layer 12a and the Schottky electrode 21 so that Schottky contact is retained. By adjusting the thicknesses, impurity concentrations, and the like of the undoped layers 12b and the n-type doped layers 12a, the breakdown voltage can be defined by the width of the depletion layer between the thicker undoped layer 12b and the Schottky electrode 21.

Since the width of the depletion layer in the uniformly doped layer varies with the impurity concentration of the uniformly doped layer in the conventional Schottky diode as shown in FIG. 9C3, it is possible to control the resistance and the breakdown voltage by adjusting the impurity concentration of the uniformly doped layer. However, a trade-off exists between a low resistance and a high breakdown voltage such that, if the impurity concentration of the uniformly doped layer is increased to lower the resistance, the width of the depletion layer is reduced and the breakdown voltage lowers, while the resistance increases if the impurity concentration of the uniformly doped layer is lowered. In the conventional Schottky diode, therefore, it is difficult to simultaneously achieve a low resistance (low power consumption) and a high breakdown voltage which are desired for a power device. If a lateral configuration is used for the conventional Schottky diode, on the other hand, it is difficult to achieve a high breakdown voltage, while providing a large current. So far, the conventional Schottky diode has been implemented only in a vertical configuration.

In the Schottky device according to the present embodiment, by contrast, carriers are distributed extensively over the n-type doped layers 12a (heavily doped layers) and the undoped layers 12b (lightly doped layers) in the forward bias state and impurity scattering is reduced in the undoped layers 12b. This allows easy movement of carriers (electrons) from the withdrawn doped layer 22 to the Schottky electrode 21. Conversely, carriers are not present in the undoped layers 12b by the carrier depletion in the reverse bias state so that it is difficult to allow electrons to flow from the Schottky electrode 21 to the withdrawn doped layer 22 only through the extremely thin n-type doped layer 12a. By thus focusing attention on the state of carrier distribution which is different in the forward bias state and in the reverse bias state, the trade-off between a low resistance and a high breakdown voltage observed in the conventional Schottky diode can be eliminated with the MESFET according to the present embodiment.

The power diode thus formed in the lateral configuration facilitates the integration of the power diode in conjunction with a power MOSFET and the like in a common SiC substrate. Since it is difficult to achieve a high breakdown voltage, while providing a large current in the conventional Schottky diode formed in a lateral configuration, a high-power Schottky diode should inevitably be formed in a vertical configuration. By contrast, the Schottky diode according to the present embodiment can be used also as a power device by eliminating the trade-off between a low resistance and a high breakdown voltage and providing a large amount of current. If an integrated circuit device is constructed by integrating the Schottky diode according to the present embodiment in conjunction with a MESFET, a MOSFET, and the like in a common SiC substrate, the integrated circuit device can be used for equipment for a communication system. In that case, prominent effects are achieved such that impedance matching in equipment for a communication system handling an RF signal is performed more easily than in the vertical Schottky diode of discrete type and the operating frequency is increased.

The vertical Schottky diode having a capacitor structure is disadvantageous in that the operating frequency is lowered by a parasitic capacitance. By contrast, the lateral Schottky diode according to the present embodiment has no capacitor structure so that it offers the advantage of a further increase in operating frequency.

In conventional equipment for a communication system such as a base station, a diode is provided on a silicon substrate. In that case, not a Schottky diode but a pin diode or a pn diode is formed normally in terms of the characteristics of silicon. By using a SiC substrate, however, a Schottky diode can be formed easily as in the present embodiment. Since the Schottky diode is characterized in that a carrier requires a shorter time to recover than in the pin diode or pn diode, a structure suitable for higher-speed operation is obtainable.

MESFET

In the MESFET 30, carriers in the n-type doped layers 12a are so distributed as to spread out to the undoped layers 12b under a quantum effect, similarly to the Schottky diode 20. If a forward bias is applied to the MESFET 30 in this state, the potential of the first multilayer portion 12 is increased and electrons are supplied constantly to the n-type doped layers 12a and to the undoped layers 12b. Consequently, a current easily flows between the source and drain electrodes through both of the n-type doped layers 12a and the undoped layers 12b in the first multilayer portion 12. Since the impurity concentration in each of the undoped layers 12b is low, impurity scattering in the undoped layers 12b is reduced so that a low resistance is retained and low power consumption and a large current are achieved.

When the MESFET is in the OFF state, a depletion layer expands from the undoped layers 12b to the n-type doped layers 12a in the first multilayer portion 12 so that the whole first multilayer portion 12 is easily depleted and a high breakdown voltage is obtained. Consequently, a device for a power amplifier having a low ON-state resistance, high power, and a high breakdown voltage is obtainable.

A description will be given herein below to the result of evaluating the performance of the MESFET according to the present embodiment and to a comparison made between the performance of the MESFET according to the present embodiment and the performance of a conventional MESFET based on items disclosed in the PCT application (PCT/JP00/01855) by the present inventors.

First, the MESFET according to the present embodiment and the conventional MESFET were compared for a gate-to-source breakdown voltage. The MESFET according to the present invention which used, as the channel region, the active region formed by alternately stacking the five undoped layers and the five n-type doped layers (multiple δ-doped layer) had a dielectric breakdown voltage of 120 V corresponding to four times the breakdown voltage of the conventional MESFET.

Next, the dependence of the relationship between drain current and drain voltage on gate voltage (I–V characteristic) was examined for the MESFET according to the present embodiment. By applying a voltage to the gate electrode 32 with the application of a constant voltage between the source electrode 34 and the drain electrode 35, a source-to-drain current was modulated in accordance with the voltage applied to the gate electrode 32 so that a switching operation was performed. At that time, a stable drain current was obtained without a breakdown even when the drain voltage was 140 V or higher.

Figure 10:
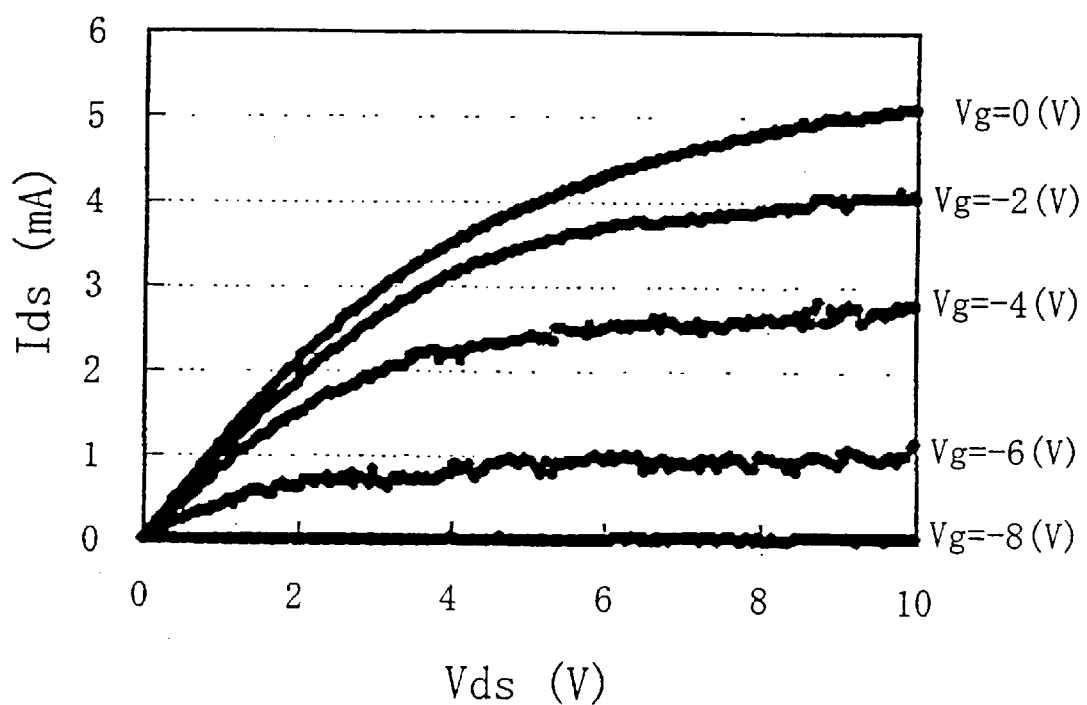
FIG. 10 shows the result of measuring the dependence of the relationship between drain current and drain voltage on gate voltage (I–V characteristic) in the MESFET according to the embodiment.

FIG. 10 shows the result of measuring the dependence of the relationship between drain current and drain voltage on gate voltage (I–V characteristic) for the MESFET according to the present embodiment. In the drawing, the horizontal axis represents the drain voltage Vds (V) and the vertical axis represents the drain current Ids (A), while the gate voltage Vg is used as a parameter.

Further, a transconductance in the vicinity of the threshold voltage was measured for each of the MESFET according to the present embodiment and the conventional MESFET. As a result, it was found that the transconductance of the MESFET according to the present embodiment using the foregoing first multilayer portion 12 as the channel layer was about double the transconductance of the conventional MESFET using the uniformly doped layer as the channel layer. This is because the mobility of an electron in the MESFET according to the present embodiment was increased as described above.

The foregoing results show that the MESFET according to the present embodiment can achieve the effects of low power consumption, a high breakdown voltage, and a high gain.

If a comparison is made between the power amplifier according to the present embodiment and a conventional power amplifier, the following differences are observed therebetween in correspondence with the foregoing functional differences between the MESFET according to the present embodiment and the conventional MESFET.

Figure 20:
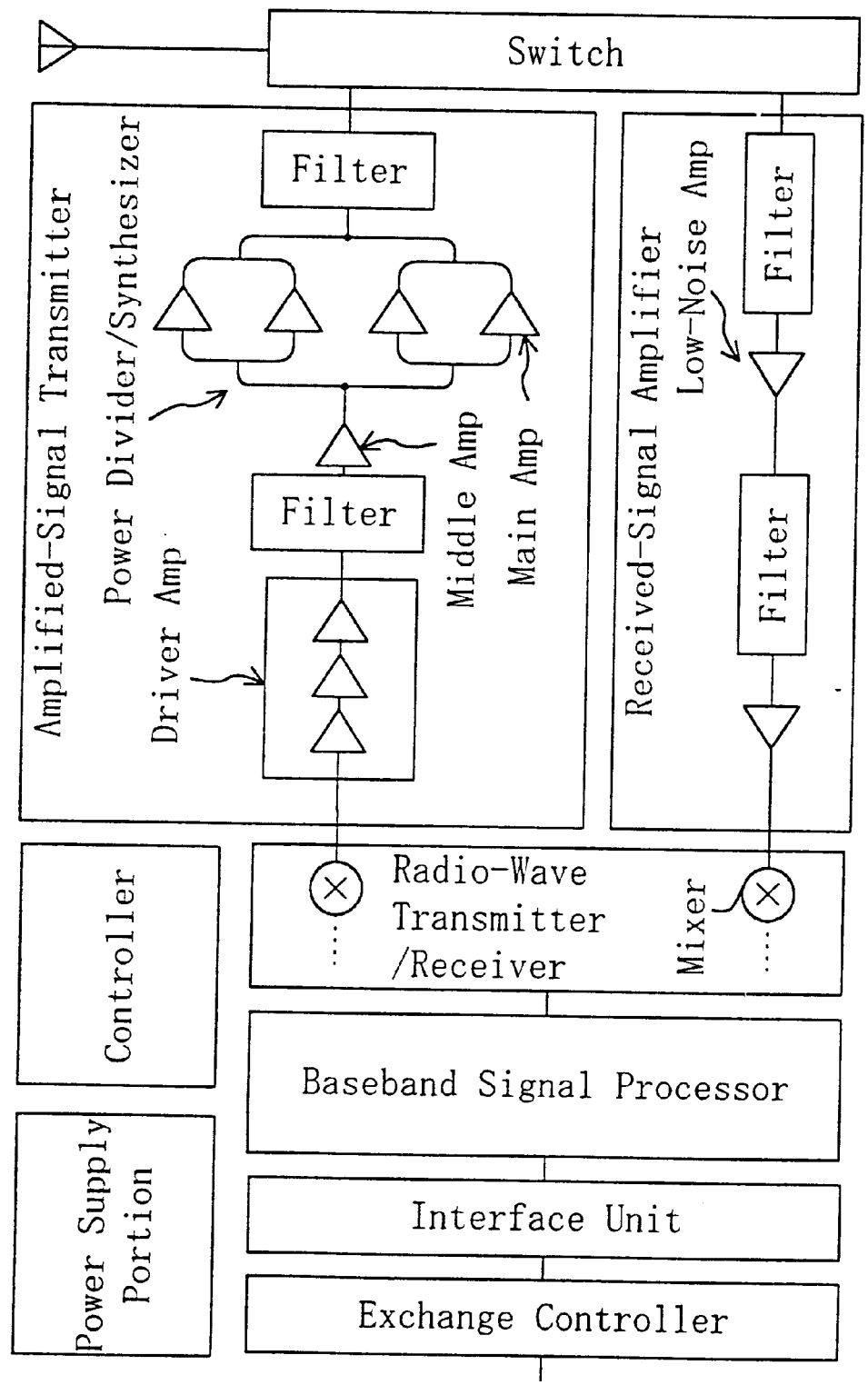
FIG. 20 is a block circuit diagram showing an internal structure of a conventional base station (base station in a communication system).

At the conventional base station, the amplified-signal transmitter which requires amplification of high power has four main amplifiers each comprising a MESFET placed therein, as shown in FIG. 20. However, it becomes more difficult to achieve impedance matching between the individual MESFETs as a larger number of MESFETs are provided and the difficulty of impedance matching increases as the frequency of an RF signal is higher.

By contrast, the present embodiment can obtain a desired power by merely disposing one main amplifier 138 comprising a MESFET in the amplified-signal transmitting circuit. By thus reducing the number of MESFETs, the structure of an impedance matching circuit can be simplified in a circuit handling an RF signal in a high frequency range compared with a circuit in the conventional base station. In addition, the Schottky diodes are integrated in conjunction with the MESFETs in the single SiC substrate, as described above, and the number thereof is reduced. This further simplifies the structure of the impedance matching circuit and allows a semiconductor integrated circuit device in which MESFETs according to the present embodiment are mounted to be incorporated into a communication system handling an RF signal on, e.g., the GHz order.

MOSFET

When the nMOSFET 40 is in an inverted state in which carriers flow with the application of a driving voltage to the gate electrode 42, electrons gather at a conduction band edge that has been bent upward by the potential eV corresponding to the applied voltage V, so that the electrons flow in the portion of the second multilayer portion 13 serving as the channel in response to the potential difference between the source region 43a and the drain region 43b. Since carriers (electrons) are distributed at a concentration which is highest immediately below the gate insulating film 41 and gradually lowers in the downward direction, it follows therefore that the undoped layer 13b which is the region immediately below the gate insulating film 41 actually occupies the majority of the channel layer. However, since the undoped layer 13b has not substantially been doped with an impurity, scattering of carriers flowing in the undoped layer 13b by impurity ions is reduced. In other words, scattering of carriers by impurity ions which interrupts the flow of carriers in the second multilayer portion 13 is reduced so that a high channel mobility is achieved.

Since the gate insulating film of a MOSFET is in most cases an oxide film formed by thermally processing a substrate, negative charges trapped in the gate insulating film 41 formed by thermally oxidizing the undoped layer 13b are small in number. Moreover, electrons flowing particularly in the uppermost undoped layer 13b of the second multilayer portion 13 hardly undergo a flow interrupting action resulting from the interaction between the charges in the gate insulating film 41 and themselves. This also contributes to an increase in channel mobility. When the driving voltage is not applied to the gate electrode 42, even if a high voltage is applied between the source region 43a and the drain region 43b, the depletion layer expands easily from the undoped layer 13b to the n-type doped layer 13a similarly to the MESFET 30 so that a high breakdown voltage is obtained.

As a result, the excellent characteristics of a low ON-state resistance with a high breakdown voltage, a large current capacitance, and a high transconductance are achieved. Even if a drain voltage is, e.g., 400 V or higher, a stable drain current is obtained without a breakdown and a dielectric breakdown voltage in the MOSFET in the OFF state is 600 V or more.

In the case where a pMOSFET is provided, holes flowing in the channel region also hardly undergo an interrupting action by scattering impurity ions in the channel region or by positive charges trapped in the impurity in the gate insulating film, similarly to the nMOSFET, so that the characteristics of a low ON-state resistance with a high breakdown voltage, a large current capacitance, and a high transconductance are achieved.

Capacitor

If the BST film is formed to occupy an area which is, e.g., 5 mm square, the capacitor 50 provides a capacitance of about 22 $\mu$F since the BST film has a relative dielectric constant of about 1000 and the thickness thereof can be reduced to about 10 nm. In short, a capacitor occupying a small area and having a large capacitance can be formed.

If a conductor film having a spiral configuration with a line width of 9 $\mu$m is provided with a 4-$\mu$m spacing in an area which is about 5 mm square, the inductor 60 has about 160 turns and an inductance of 780 $\mu$H. In short, an inductor occupying a small area and satisfying desired specifications can be provided.

Each of the multilayer portions in the Schottky diode, the MESFET, and the MOSFET may have only one heavily doped layer and only one lightly doped layer. Either one of the heavily doped layer and the lightly doped layer may be formed previously to the formation of the other. It is also possible to place two lightly doped layers (undoped layers) above and below one heavily doped layer. That is, the number of heavily doped layers may be different from the number of lightly doped layers.

Fabrication Process

Figure 11A:
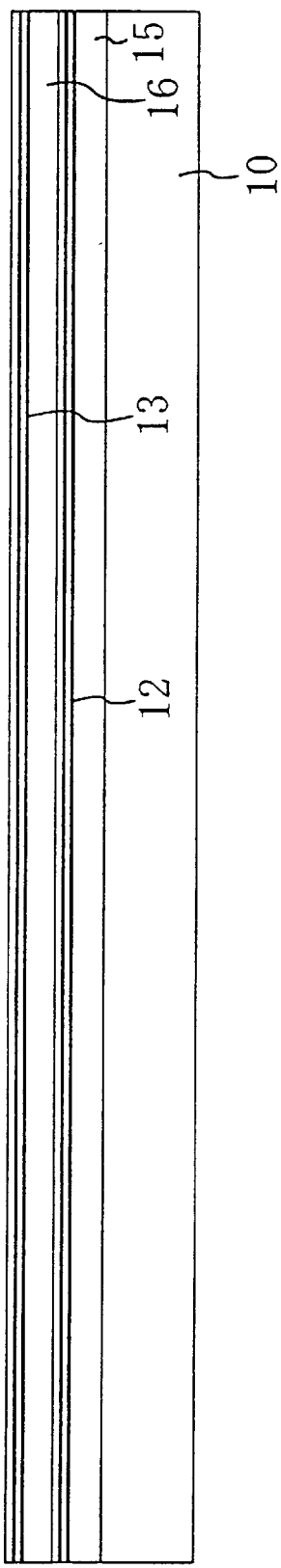
FIG. 11A to FIG. 11C are cross-sectional views illustrating process steps of fabricating the semiconductor device according to the embodiment from the formation of first and second multilayer portions to the formation of an isolation regions.
Figure 13A:
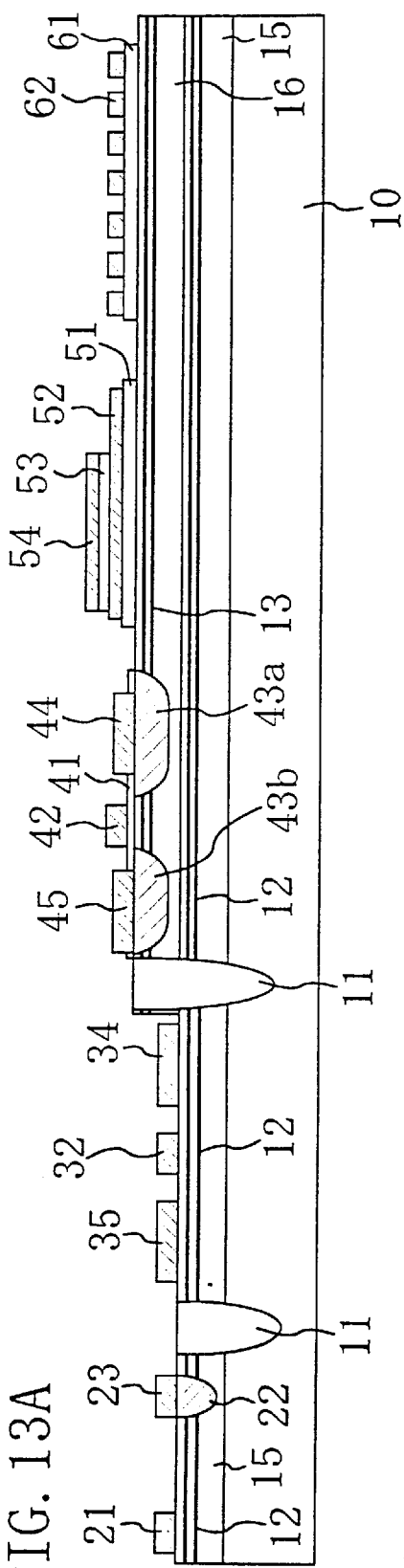
FIG. 13A and FIG. 13B are cross-sectional views illustrating the process steps of fabricating the semiconductor device according to the embodiment from the formation of the upper electrodes of capacitors to the formation of contact holes connecting to the respective conductor portions of the elements.
Figure 13B:
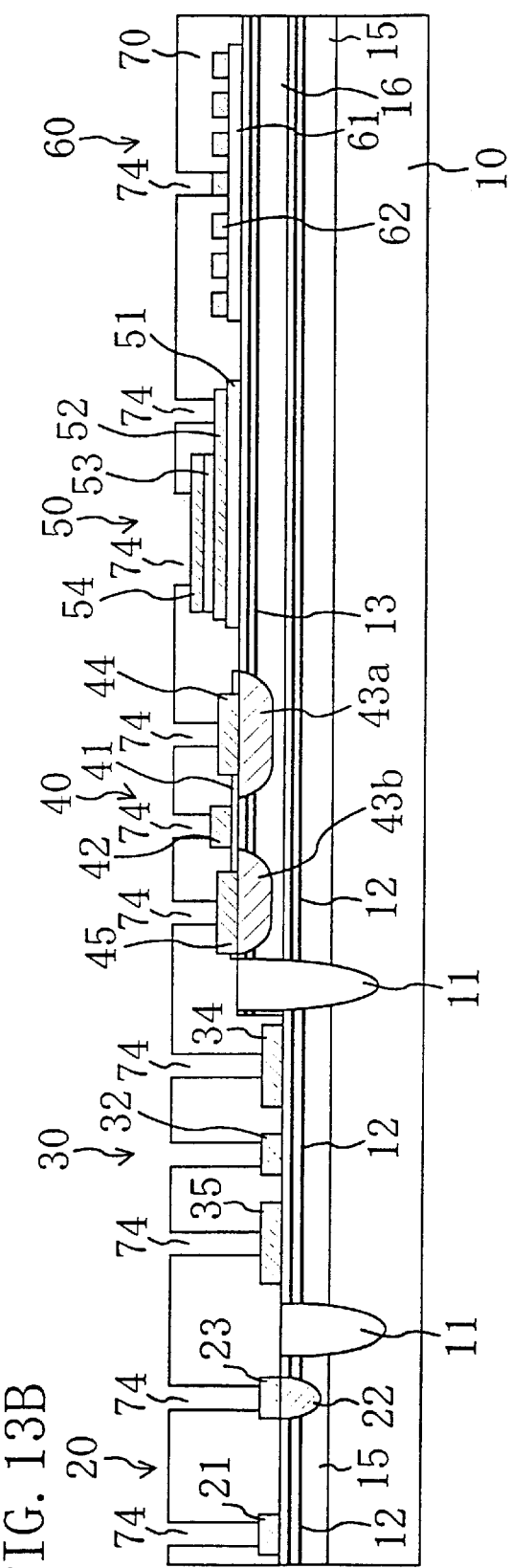

Referring to FIG. 11A to FIG. 13B, the process for fabricating the semiconductor device according to the present embodiment will be described. FIG. 11A to FIG. 11C are cross-sectional views illustrating the process steps of fabricating the semiconductor device according to the present embodiment from the formation of the first and second multilayer portions to the formation of the isolation regions. FIG. 12A to FIG. 12C are cross-sectional views illustrating the process steps of fabricating the semiconductor device according to the present embodiment from the formation of the source/drain regions to the formation of the electrode or conductor film of each of elements. FIG. 13A and FIG. 13B are cross-sectional views illustrating the process steps of fabricating the semiconductor device according to the present embodiment from the formation of the upper electrodes of capacitors to the formation of contact holes connecting to the respective conductor portions of the elements. A crystal growing apparatus and a crystal growing method used in the present embodiment are based on a structure or method disclosed in the specifications and drawings of Japanese Patent Application 2000-58964 or 2000-06210.

First, in the step shown in FIG. 11A, the p-type SiC substrate 10 is prepared. In the present embodiment, a 4H-SiC substrate having a principal surface in orientation coincident with the {11-20} plane (A plane) is used as the SiC substrate 10. It is also possible to use a SiC substrate having a principal surface in orientation several degrees deviated from the (0001) plane (C plane).

In a water vapor atmosphere bubbled with oxygen at a flow rate of 5 (1/min), the SiC substrate 10 is thermally oxidized at 1100° C. for about 3 hours such that a thermal oxide film with a thickness of about 40 nm is formed on a surface of the SiC substrate 10. Then, the thermal oxide film is removed in a buffered fluoric acid (fluoric acid aqueous ammonium fluoride solution=1:7). The SiC substrate 10 is placed in the chamber of a CVD apparatus and the pressure in the chamber is reduced to reach a vacuum degree of about $10^6$ Pa ($\approx 10^{-8}$ Torr). Then, a hydrogen gas at a flow rate of 2 (1/min) and an argon gas at a flow rate of 1 (1/min) are supplied as diluent gases (carrier gases) into the chamber, the pressure in the chamber is adjusted to 0.0933 MPa, and the substrate temperature is adjusted to about 1600° C. As raw-material gases, a propane gas at a flow rate of 2 (ml/min) and a silane gas at a flow rate of 3 (ml/min) are introduced into the chamber, while the respective flow rates of the hydrogen gas and the argon gas are held at the foregoing constant values. The raw-material gases have been diluted with a hydrogen gas at a flow rate of 50 (ml/min). In the chamber, nitrogen (doping gas) as an n-type impurity is supplied pulsatingly, while the raw-material gases and the diluent gases are supplied, so that the first lightly doped layer 15 with a thickness of about 1200 nm is formed on the principal surface of the SiC substrate 10. As a doping gas, e.g., nitrogen is contained in a high-pressure bottle and a pulse valve is provided between the high-pressure bottle and a pipe for supplying the doping gas. The doping gas can be supplied pulsatingly to a space immediately above the SiC substrate 10 in the chamber by repeatedly opening and closing the pulse valve, while supplying the raw-material gases and the diluent gasses.

Next, the n-type doped layer (heavily doped layer) 12a with a thickness of about 10 nm is formed on the lightly doped layer 15. A level difference in impurity concentration can be produced easily by reducing the period (pulse width) during which the pulse valve is opened during the formation of the lightly doped layer 15 and increasing the period (pulse width) during which the pulse valve is opened during the formation of the n-type doped layer 12a. Instead of the first lightly doped layer 15, an undoped layer may also be formed.

When the epitaxial growth of the n-type doped layer 12a is completed, the propane gas and the silane gas are supplied to the space above the SiC substrate 10 while halting the supply of the doping gas, i.e., with the pulse valve closed completely, whereby the undoped layer 12b (lightly doped layer) composed of an undoped SiC single crystal and having a thickness of about 50 nm is grown epitaxially over the principal surface of the SiC substrate 10.

Each of the step of forming the n-type doped layer 12a by introducing the doping gas through the opening and closing of the pulse valve, while simultaneously supplying the raw-material gases, and the step of forming the undoped layer 12b by supplying only the raw-material gases without supplying the doping gas, while holding the pulse valve closed, is repeated five times, whereby the first multilayer portion 12 composed of the five n-type doped layers 12a and the five undoped layers 12b which are alternately stacked is formed. At this time, the undoped layer 12b is formed as the uppermost layer and the thickness of the uppermost undoped layer 12b is adjusted to be larger by about 15 nm than those of the other undoped layers 12b. A mean concentration of nitrogen in the first multilayer portion 12 is about $1\times10^{17}$ atoms cm$^{-3}$ and the total thickness of the first multilayer portion 12 is about 300 nm.

Next, the doping gas is switched to a gas (doping gas) containing aluminum as a p-type impurity, while the raw-material gases and the diluent gases are supplied continuously, whereby the lightly doped layer 16 with a thickness of about 1200 nm is formed on the first multilayer portion 12. As the doping gas, e.g., a hydrogen gas containing about 10% of trimethyl aluminum Al(CH$_3$)$_3$ is used.

Then, the p-type doped layer (heavily doped layer) 13a with a thickness of about 5 nm is formed by introducing the doping gas (hydrogen gas containing the trimethyl aluminum gas) through the opening and closing of the pulse valve, while simultaneously supplying the raw material gases, similarly to the foregoing procedure for forming the first multilayer portion 12. Each of the step of forming the p-type doped layer 13a and the step of forming the undoped layer 13b by supplying only the raw material gases without supplying the doping gas, while holding the pulse valve closed, is repeated twenty times, whereby the second multilayer portion 13 composed of the twenty p-type doped layers 13a and the twenty undoped layers 13b which are alternately stacked is formed. At that time, the undoped layer 13b is formed as the uppermost layer and the thickness of the uppermost undoped layer 13b is adjusted to be larger by about 15 nm than those of the other undoped layers 13b. A mean concentration of aluminum in the second multilayer portion 13 is about $1\times10^{17}$ atoms cm$^{-3}$ and the total thickness of the second multilayer portion 13 after the completion of thermal oxidation is about 1100 nm.

Figure 11B:
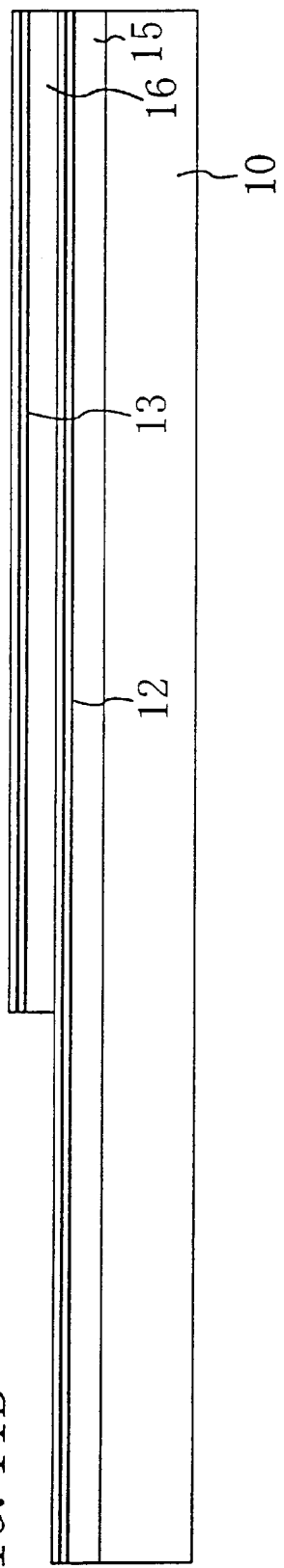

Next, in the step shown in FIG. 11B, the regions of the second multilayer portion 13 and the second lightly doped layer 16 in which the Schottky diode 20 and the MESFET 30 are to be formed are removed by selective etching so that the first multilayer portion 12 is exposed in each of the regions in which the Schottky diode 20 and the MESFET 30 are to be formed.

Figure 11C:
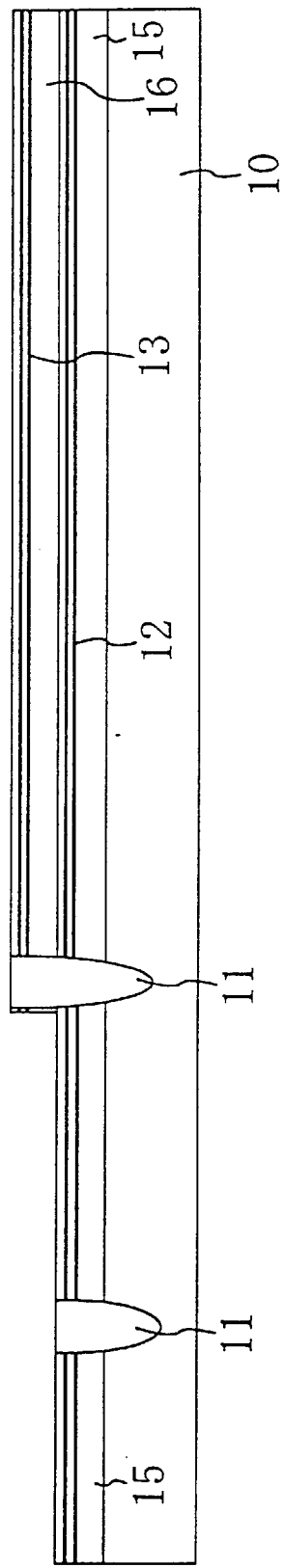

Next, in the step shown in FIG. 11C, trenches for forming the isolation regions are formed in the substrate and a silicon oxide film is buried in each of the trenches to form the isolation regions 11.

Next, in the step shown in FIG. 12A, the electrode withdrawn layer 22 for the Schottky diode 20 is formed by implanting an n-type impurity (e.g., nitrogen ions N$^+$). At this time, an implant mask composed of a silicon dioxide film or the like which covers the region other than the region in which the n-type impurity ions are to be implanted and has an opening corresponding to the region in which the n-type impurity ions are to be implanted is formed on the substrate. Then, the substrate is heated to a temperature of 500 to 800° C. and nitrogen ions (N$^+$) and the like are implanted from above the implant mask. Further, annealing for activating the impurity is performed at 1500° C. for 10 minutes, whereby the electrode withdrawn layer 22 containing the n-type impurity at a concentration of about $1\times10^{18}$ atoms cm$^{-3}$ is formed. At this time, nitrogen ions (N$^+$) are implanted into the substrate in, e.g., six steps of ion implantation using different implant energies. For example, the first ion implantation is performed with an acceleration voltage of 180 keV and at a dose of $1.5\times10^{14}$ atoms cm$^{-2}$, the second ion implantation is performed with an acceleration voltage of 130 keV and at a dose of $1\times10^{14}$ atoms cm$^{-2}$, the third ion implantation is performed with an acceleration voltage of 110 keV and at a dose of $5\times10^{13}$ atoms cm$^{-2}$, the fourth ion implantation is performed with an acceleration voltage of 100 keV and at a dose of $8\times10^{13}$ atoms cm$^{-2}$, the fifth ion implantation is performed with an acceleration voltage of 60 keV and at a dose of $6\times10^{13}$ atoms cm$^{-2}$, and the sixth ion implantation is performed with an acceleration voltage of 30 keV and at a dose of $5\times10^{13}$ atoms cm$^{-2}$. In any of the six ion implantations, the direction in which ions are implanted is 7. tilted from a normal to the SiC substrate 10 and the implant depth is about 0.3 $\mu$m. At this time, a thin heavily doped layer for contact is also formed in each of portions located immediately below the source/drain electrodes of the MESFET 30.

Similarly, the source and drain regions 43a and 43b of the nMOSFET 40 are formed by implanting an n-type impurity (e.g., nitrogen ions N$^+$). At this time, an implant mask composed of a silicon dioxide film or the like which covers the region other than the region in which the n-type impurity ions are to be implanted and has an opening corresponding to the region in which the n-type impurity ions are to be implanted is formed on the substrate. Then, the substrate is heated to a temperature of 500 to 800° C. and nitrogen ions (N$^+$) and the like are implanted from above the implant mask. Further, annealing for activating the impurity is performed at 1500° C. for 10 minutes, whereby the source and drain regions 43a and 43b each at an implant depth of about 0.8 $\mu$m and containing the n-type impurity at a concentration of about $1\times10^{18}$ atoms cm$^{-3}$ is formed. At this time, an n-type impurity (e.g., nitrogen ions N$^+$) is also implanted thin into the portions located immediately below the source and drain electrodes of the MESFET 30.

Next, in the step shown in FIG. 12B, the implanted mask is removed and then a SiN film with a thickness of about 0.4 $\mu$m is formed by plasma CVD on the substrate and patterned to form the underlying insulating film 51 and the dielectric film 61 on the respective regions of the second multilayer portion 13 on which the capacitor 50 and the inductor 60 are to be formed.

Next, in the step shown in FIG. 12C, a surface portion (corresponding to a thickness of about 15 nm) of the uppermost undoped layer 13b of the second multilayer portion 13 is thermally oxidized at a temperature of about 1100° C. in the region to be formed with the MOSFET, thereby forming the gate insulating film 41 composed of a thermal oxide film with a thickness of about 30 nm. Then, openings are formed by removing the portions of the gate insulating film 41 located above the source and drain regions 43a and 43b such that the source and drain electrodes 44 and 45 composed of a Ni alloy film formed by vacuum vapor deposition are formed in the openings. At the same time, the ohmic electrode 23, the source electrode 34, and the drain electrode 35 also composed of the Ni alloy film are formed on the withdrawn electrode 22 of the Schottky diode 20 and on the first multilayer portion 12. Further, annealing is performed at 1000° C. for 3 minutes to provide ohmic contact between the source electrodes 34 and 44, the drain electrodes 35 and 45, and the ohmic electrode 23 and the multilayer portions 12 and 13 or the electrode withdrawn layer 22. Subsequently, a nickel (Ni) alloy film is vapor-deposited on the gate insulating film 41 so that the gate electrode 42 composed of the nickel alloy film and having a gate length of about 1 $\mu$m is formed. On the other hand, nickel is vapor-deposited on the regions of the first multilayer portion 12 on which the Schottky diode 20 and the MESFET 30 are to be formed so that the Schottky electrodes 21 and the Schottky gate electrode 32 each composed of nickel are formed, while platinum (Pt) is vapor-deposited on the underlying insulating film 51 of the capacitor 50 such that the lower electrode 52 composed of platinum is formed.

Next, a resist film having a spiral opening is formed on the region on which the inductor 60 is to be formed. A Cu film with a thickness of about 4 μm is deposited on the resist film and lifted off, whereby the spiral conductor film 62 is left on the dielectric film 61. It is also possible to compose the conductor film of an aluminum alloy film instead of the Cu film. In that case, the aluminum alloy film is deposited and patterned by RIE dry etching using a $Cl_2$ gas and a $BCl_3$ gas, thereby forming the spiral conductor film 62.

Next, in the step shown in FIG. 13A, a BST film is formed by sputtering on the lower electrode of the capacitor 50. Then, a platinum (Pt) film is formed by vapor deposition on the BST film. The platinum film and the BST film are patterned into a specified configuration to form the upper electrode 54 and the capacitance insulating film 53.

Next, in the step shown in FIG. 13B, the interlayer insulating film 70 composed of a silicon dioxide film is deposited on the substrate. The interlayer insulating film 70 is formed with contact holes 74 reaching the Schottky electrode 21 and ohmic electrode 23 of the Schottky diode 20, the Schottky gate electrode 32 and source and drain electrodes 34 and 35 of the MESFET 30, the gate, source, and drain electrodes 42, 44, and 45 of the nMOSFET 40, the upper and lower electrodes 54 and 52 of the capacitor 50, and the center and outer circumferential end portions of the spiral conductor film 62 of the inductor 60.

Thereafter; an aluminum alloy film is formed in each of the contact holes 72 and on the interlayer insulating film 70 and patterned to provide the structure of the semiconductor device shown in FIG. 3.

Thus, the fabrication method according to the present embodiment allows easy formation of the Schottky diode, the MESFET, the MOSFET, the resistor element, the inductor, and the like on the single SiC substrate. Since the MESFET and the Schottky diode are allowed to be provided on the common SiC substrate by forming the active elements such as the MESFET, the Schottky diode, and the like in the lateral structure, integration is particularly facilitated. Since the passive element such as the inductor is also allowed to be mounted on the common SiC substrate, further scaling down is achievable.

Although the present embodiment has used the SiC substrate, the present embodiment is applicable not only to a semiconductor device provided on the SiC substrate but also to all semiconductor devices provided on a compound semiconductor substrate composed of a compound of a plurality of elements such as GaAs, GaN, AlGaAs, SiGe, and SiGeC (in which a layer composed of GaAs, AlGaAs, GaN, AlGaN, InGaN, SiGe, SiGeC, or the like is used as the active layer). In that case also, the provision of the multilayer portion composed of the δ-doped layers and the lightly doped layers (including undoped layers) under the gate insulating film allows improvements in channel mobility and breakdown voltage by using reduced scattering by impurity ions, depletion of the whole channel region in the OFF state, trapping of charges in the impurity in the δ-doped layers (compensation for charges).

Exemplary Structure of Mobile Terminal

Figure 14:
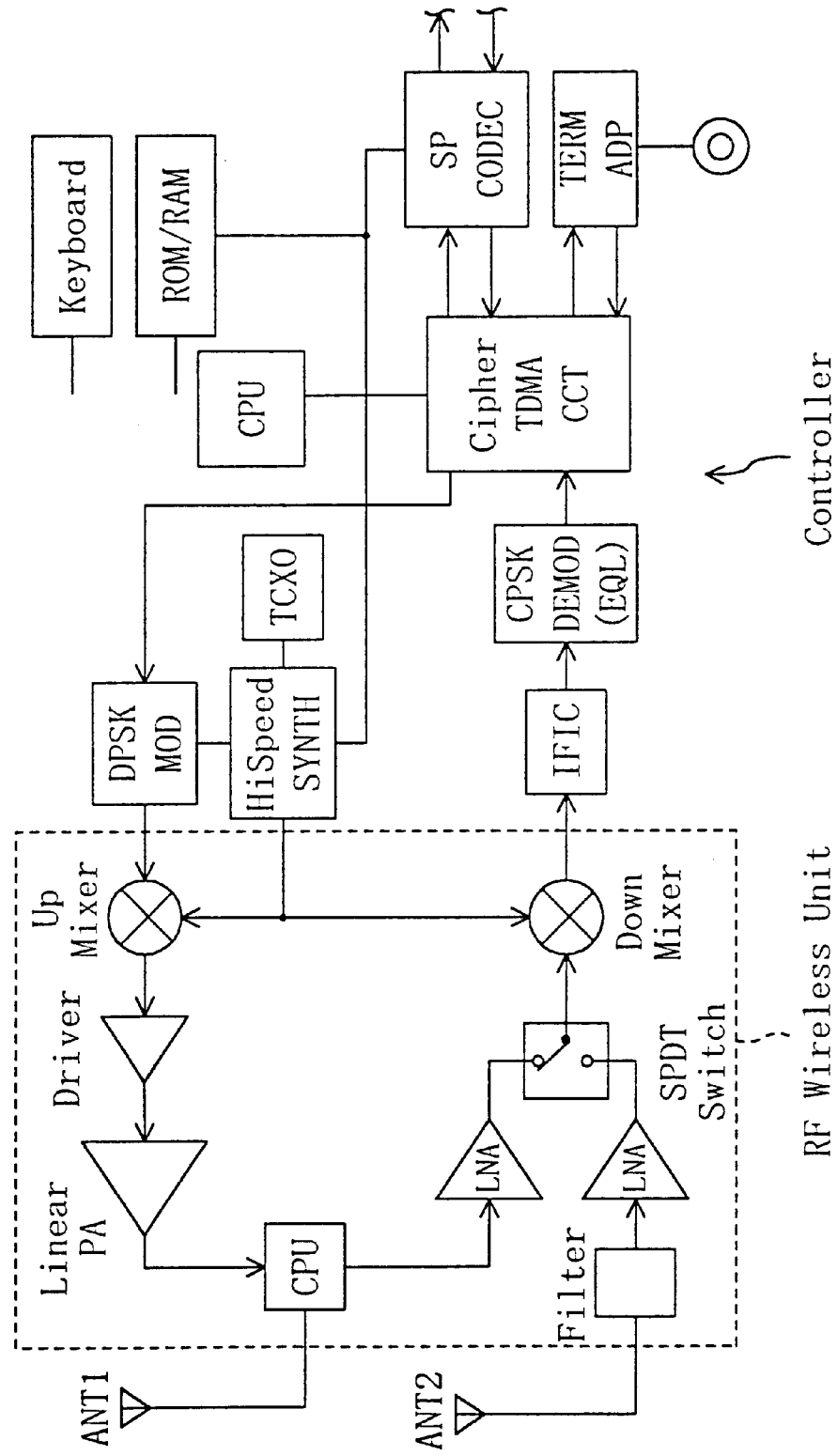
FIG. 14 schematically shows an example of a mobile phone terminal (mobile station) in the communication system shown in FIG. 1.

FIG. 14 schematically shows an example of the mobile phone terminal (mobile station) 102 in the communication system shown in FIG. 1. A PDC system is adopted here. The RF wireless unit shown in FIG. 14 includes a received-signal amplifier 122 and the amplified-signal transmitter 123 shown in FIG. 1. The controller of the mobile terminal 102 as the mobile station shown in FIG. 1 is composed of the CPU, the cipher TDMA-CCT, the SP-CODEC, the ROM/RAM, the TERM-ADP, the DPSK-MOD, the HiSpeedSYNTH, the IF-IC, and the CPSK-DEMOD (EQL) shown in FIG. 14.

The linear PA (power amplifier) in the RF wireless unit shown in FIG. 14 can be composed of, e.g., the circuit having the MESFET disposed therein shown in FIG. 3. In that case, the MOSFET in each of circuits for the controller can be composed of the MOSFET (n-channel or p-channel MOSFET) shown in FIG. 4.

Figure 15:
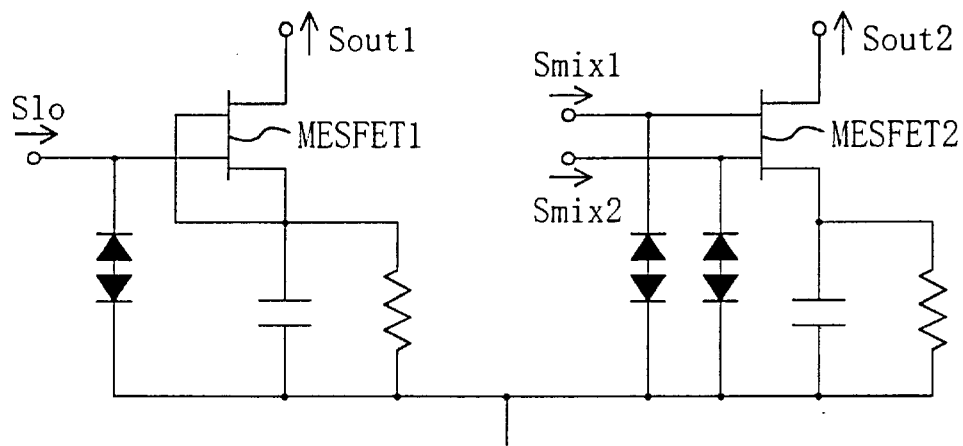
FIG. 15 is an electric circuit diagram showing an exemplary circuit configuration of a mixer shown in FIG. 2 or 14.

FIG. 15 is an electric circuit diagram showing an exemplary circuit structure of the mixer 134 shown in FIG. 2 or the mixer shown in FIG. 14. The example shown here has a local amplifier. Specifically, a MESFET 1 for amplifying a local signal which receives a local signal $Al_0$ at the gate and outputs a signal Sout1 obtained by amplifying the local signal $Al_0$ and a MESFET 2 for amplifying a mixer signal which receives two signals Smix1 and Smix2 at the gate and outputs a signal Sout2 obtained by mixing and amplifying the signals Smix1 and Smix2 are disposed. It is possible to form the MESFET, the diode, and the capacitor in the circuit on a single SiC substrate as shown in, e.g., FIG. 4 and thereby compose a single MMIC. Since a resistor element can be regarded as a part of the conductor film of the inductor, the resistor element can be formed extremely easily on the SiC substrate, though it is not depicted in FIG. 4.

Figure 16:
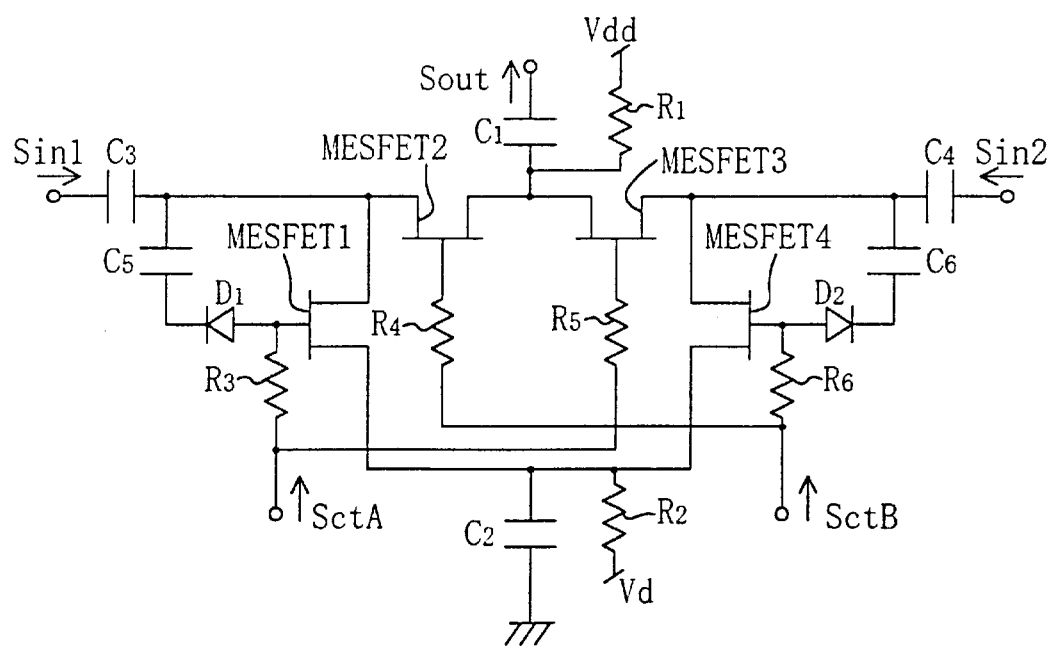
FIG. 16 is an electric circuit diagram showing an example of a high-output switch circuit containing an SPDT switch shown in FIG. 14 or a high-output switch circuit disposed in the switch shown in FIG. 2.

FIG. 16 is an electric circuit diagram showing an example of a high-output switch circuit containing a SPDT switch shown in FIG. 14 or a high-output switch circuit disposed in the switch shown in FIG. 2. In this example, the high-output switch circuit is so configured as to receive input signals Sin1 and Sin2 and output a signal Sout obtained by amplifying either of the input signals Sin1 and Sin2. It is possible to form output signal MESFETs 1 to 4, capacitors C1 to C6, diodes D1 and D2, and resistor elements R1 to R6 on a single SiC substrate and thereby compose an MMIC.

Variations

Figure 17:
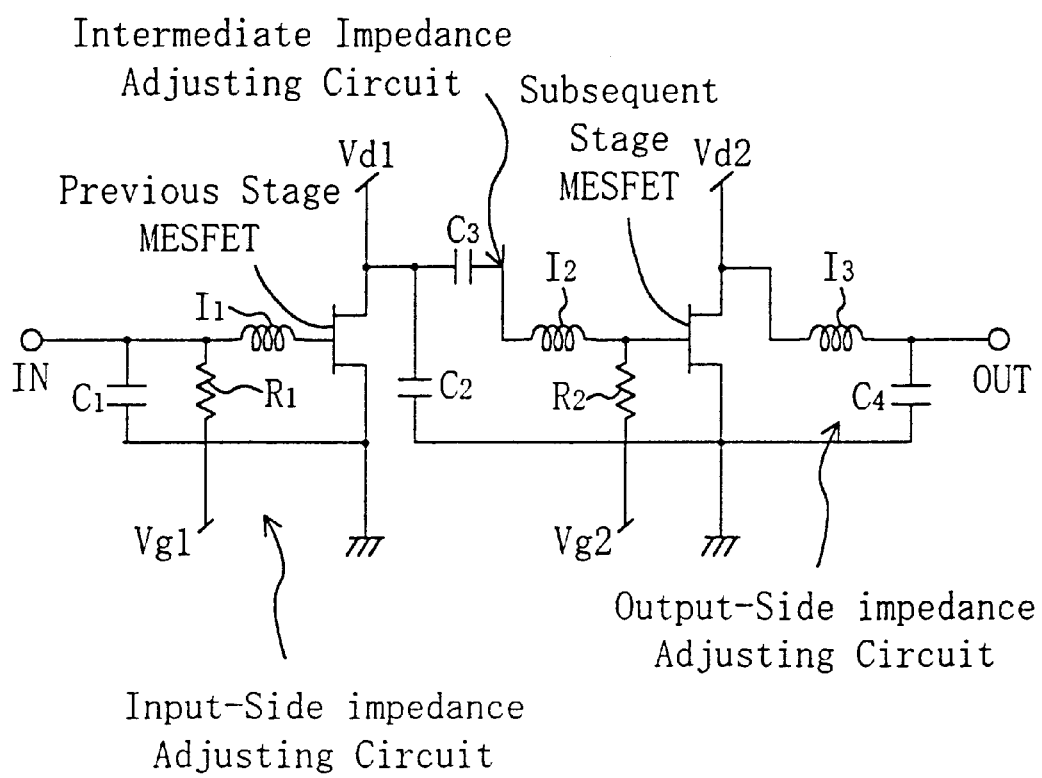
FIG. 17 shows another exemplary structure (first variation) of the main amplifier shown in FIG. 3 according to the embodiment.

FIG. 17 shows another exemplary structure (first variation) of the main amplifier shown in FIG. 3 according to the foregoing embodiment. The first variation comprises a previous-stage MESFET and a subsequent-stage MESFET which are amplifying transistors in two stages. On the input side of the previous-stage MESFET, there is provided an input-side impedance adjusting circuit having a capacitor C1, a resistor element R1, and an inductor I1. Between the previous-stage MESFET and the subsequent-stage MESFET, there is provided an intermediate impedance adjusting circuit having capacitors C2 and C3, a resistor element R2, and an inductor I2. On the output side of the subsequent-stage MESFET, there is provided an output-side impedance adjusting circuit containing a capacitor C4 and an inductor I3.

Each of the elements in the first variation can be composed of a MESFET 30, a capacitor 50, and an inductor 60 as shown in FIG. 4. Accordingly, an MMIC composed of the circuit shown in FIG. 17 which is provided on a single SiC substrate can be obtained.

Figure 18:
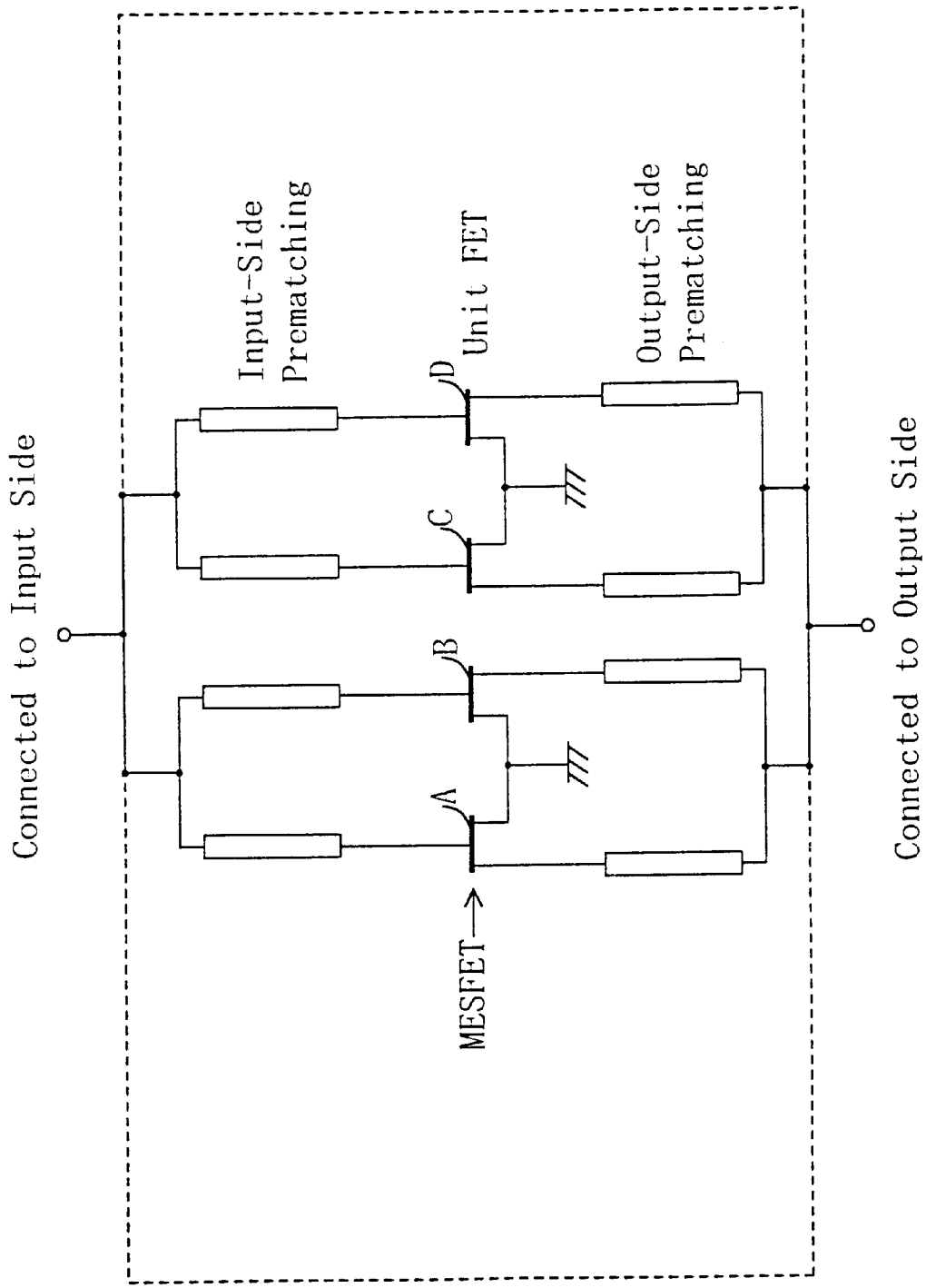
FIG. 18 shows still another exemplary structure (second variation) of the main amplifier shown in FIG. 3 according to the embodiment.

FIG. 18 shows still another exemplary structure (second variation) of the main amplifier shown in FIG. 3 according to the foregoing embodiment. The second variation has a structure in which four MESFETs A to D composing a differential amplifier are disposed in parallel. On the input side of each of the MESFETs A to D, there are provided an input-side prematching having a capacitor, a resistor element (not shown), and the like, and a bonding wire. On the output side of each of the MESFETs A to D, there are provided an output-side prematching having a capacitor, a resistor (not shown), and the like and a bonding wire.

Each of the elements in the second variation can be composed of a MESFET 30, a capacitor 50, and an inductor 60 as shown in FIG. 4. Accordingly, an MMIC composed of the circuit shown in FIG. 18 which is provided on a single SiC substrate can be obtained.

Figure 19:
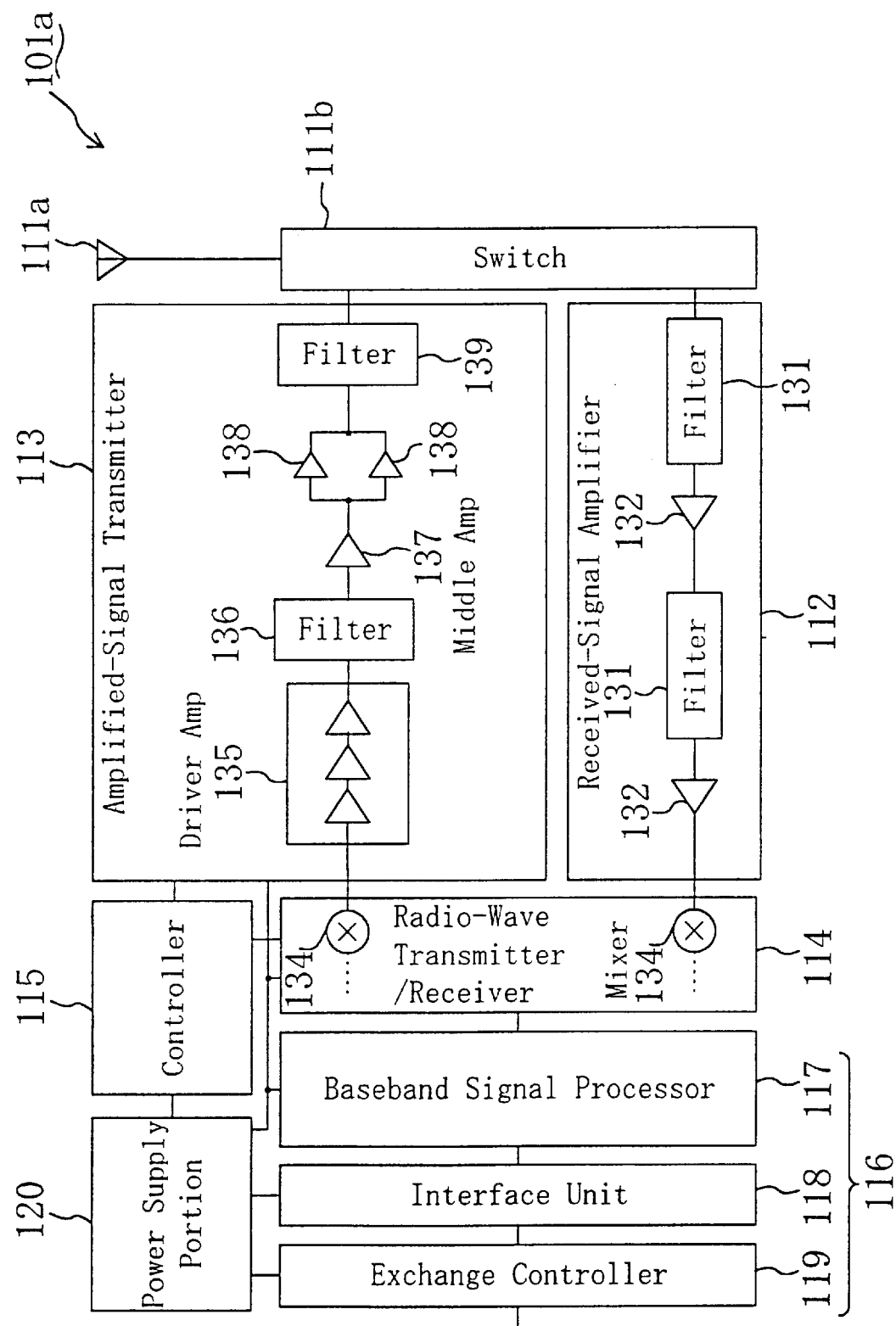
FIG. 19 is a block circuit diagram schematically showing a structure of a base station in a third variation in which two main amplifiers are disposed in parallel.

FIG. 19 is a block circuit diagram schematically showing the structure of the base station 101a in the third variation in which the two main amplifier 138 are disposed in parallel. In this case also, the two main amplifiers can be composed of the circuit shown in FIG. 3.

If the respective amplifier circuits shown in FIG. 3, FIG. 16, and FIG. 17 are compared, the amplifier circuits shown in FIG. 16 and FIG. 17 are preferably provided to achieve a highest amplification factor. However, the structure of the impedance matching circuit is more complicated as a larger number of MESFETs are provided. In the case of handling a signal in the RF range, particularly a signal on the GHz order, the process for achieving impedance matching (such as trimming) is complicated as a larger number of MESFETs are provided. Accordingly, it is preferable to selectively determine the structure of the base station depending on the use and scale thereof.

The MESFET, the Schottky diode, and the like which are the active elements according to the present invention are disposed on the transmitting side of the equipment for a communication system, whereby structures suitable for a high-power application such as the MESFET, the Schottky diode, and the like according to the present invention are used properly.

Other Embodiments

Although each of the foregoing embodiments has described the example in which the equipment for a communication system according to the present invention is applied to the base station and terminal (mobile station) of the mobile phone, the present invention is not limited thereto. Examples of the communication system include a car phone system, a PHS, and a PDA. By providing the equipment disposed in such a system with the MESFET, the diode, the MOSFET, the capacitor, the inductor, and the like shown in FIG. 4, the same effects as achieved by the foregoing embodiments are achievable.

Although each of the foregoing embodiments has used the SiC substrate, a large-current characteristic and a high breakdown voltage are attainable even if the multilayer portion shown in FIG. 4 which is composed of the δ-doped layers and the undoped layer (in which a layer composed of GaAs, AlGaAs, GaN, AlGaN, InGaN, SiGe, SiGeC, or the like is used as the active layer) is provided by using a semi-insulating substrate other than the SiC substrate, e.g., a GaAs substrate, a GaN substrate, or the like.

What is claimed is:

1. Equipment for a communication system disposed in the communication system and having an active element by using a compound semiconductor, the active element comprising:
    a compound semiconductor layer provided on a substrate; and
    an active region provided on the compound semiconductor layer and composed of at least one first semiconductor layer functioning as a carrier flow region and at least one second semiconductor layer containing an impurity or carriers at a high concentration and smaller in film thickness than the first semiconductor layer such that the carriers are distributed therein under a quantum effect, the first and second semiconductor layers being disposed in contact with each other.

2. The equipment for a communication system of claim 1, wherein the first semiconductor layer includes a plurality of first semiconductor layers and the second semiconductor layer includes a plurality of second semiconductor layers, the first semiconductor layers and the second semiconductor layers being arranged in stacked relation.

3. The equipment for a communication system of claim 1, wherein the active element is a MESFET formed by disposing the first semiconductor layer immediately below a gate electrode.

4. The equipment for a communication system of claim 1, wherein the active element is a Schottky diode formed by disposing the first semiconductor layer immediately below a Schottky electrode.

5. The equipment for a communication system of claim 4, wherein the active element is the Schottky diode in a lateral configuration.

6. The equipment for a communication system of claim 1, wherein the active element is a MISFET comprising:
    a gate insulating film provided on the first semiconductor layer;
    a gate electrode provided on the gate insulating film; and
    source/drain regions provided on both sides of the gate electrode in the compound semiconductor layer.

7. An equipment for a communication system comprising:
    a compound semiconductor layer composed of compound semiconductor; and
    a MISFET provided on the compound semiconductor layer,
    wherein the MISFET comprises:
        an active region provided on the compound semiconductor layer,
        a gate insulating film formed on the active region,
        a gate electrode formed on the gate insulating film, and
        source/drain regions formed on both sides of the gate electrode in the active region,
    wherein a part interposed between the source/drain regions in the active region is composed by alternately stacking a plurality of first semiconductor layers and a plurality of second semiconductor layers, which contain an impurity for carriers at a high concentration and which film thickness are smaller than the film thickness of the plurality of first semiconductor layers,
    wherein the plurality of first semiconductor layers and the plurality of second semiconductor layers are made of substantially the same material, and
    wherein each of the plurality of first semiconductor layers has substantially equal thickness, and each of the plurality of second semiconductor layers has substantially equal thickness.

8. The equipment for a communication system of claim 7 further comprises a capacitor and an inductor provided on the compound semiconductor layer.

9. The equipment for a communication system of claim 7, wherein the compound semiconductor layer is a SiC layer.

10. The equipment for a communication system of claim 7, which is a base station in the communication system.

11. The equipment for a communication system of claim 7, which is a mobile station in the communication system.

12. The equipment for a communication system of claim 7, wherein the communication system is any one of a mobile phone, a PHS, a car phone, and a PDA.

13. The equipment for a communication system of claim 7, wherein the MISFET is disposed in a transmitter in the communication system.

14. The equipment for a communication system of claim 7, wherein the compound semiconductor layer is a GaAs layer or a GaN layer.

15. The equipment for a communication system of claim 7, wherein the plurality of first semiconductor layers function as a carrier flow region, and the carriers in the plurality of second semiconductor layers are distributed into the plurality of first semiconductor layers under a quantum effect.

16. The equipment for a communication system of claim 7 further comprises a second active region provided on the compound semiconductor layer, and a second MISFET provided on the second active region, wherein the second MISFET includes:

a second gate insulating film formed on the second active region, a second gate electrode formed on the second gate insulating film, and second source/drain regions formed on both sides of the second gate electrode in the second active region, wherein a part interposed between the second source/drain regions in the second active region is composed by alternately stacking a plurality of third semiconductor layers and a plurality of fourth semiconductor layers, which contain an impurity for carriers at a high concentration and which film thickness are smaller than the film thickness of the plurality of third semiconductor layers, wherein the plurality of third semiconductor layers and the plurality of fourth semiconductor layers are made of substantially the same material, and wherein each of the plurality of third semiconductor layers has substantially equal thickness, and each of the plurality of fourth semiconductor layers has substantially equal thickness.

17. The equipment for a communication system of claim 16, wherein the MISFET is a p-type MISFET and the second MISFET is an n-type MISFET.

\* \* \* \* \*

UNITED STATES PATENT AND TRADEMARK OFFICE
CERTIFICATE OF CORRECTION

PATENT NO. : 6,654,604 B2
DATED : November 25, 2003
INVENTOR(S) : Toshiya Yokogawa et al.

It is certified that error appears in the above-identified patent and that said Letters Patent is hereby corrected as shown below:

Title page,
Item [75], Inventors, the residence of the 2nd inventor, "Kunimasa Takahashi, Ibaraki (JP)" should be -- Kunimasa Takahashi, Osaka (JP) --; and the residence of the 3rd inventor, "Masao Uchida, Ibaraki (JP)" should be -- Masao Uchida, Osaka (JP) --
Item [56], References Cited, FOREIGN PATENT DOCUMENTS, "EP 0 555 388 A2" should be -- EP 0 555 886 A2 --

Column 25,
Line 54, "element by" should be -- element formed by --
Line 63, "or" should be -- for --

Signed and Sealed this

Twelfth Day of October, 2004

JON W. DUDAS
*Director of the United States Patent and Trademark Office*